(12) United States Patent
Lamanna

(10) Patent No.: US 7,122,294 B2
(45) Date of Patent: Oct. 17, 2006

(54) PHOTOACID GENERATORS WITH PERFLUORINATED MULTIFUNCTIONAL ANIONS

(75) Inventor: William M. Lamanna, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 36 days.

(21) Appl. No.: 10/444,124

(22) Filed: May 22, 2003

(65) Prior Publication Data

US 2004/0234888 A1    Nov. 25, 2004

(51) Int. Cl.
G03F 7/30 (2006.01)
G03F 7/029 (2006.01)
G03F 7/039 (2006.01)
G03F 7/038 (2006.01)
C08F 2/50 (2006.01)
C08F 2/48 (2006.01)
C07D 295/104 (2006.01)
C07D 333/16 (2006.01)
C07D 333/08 (2006.01)
C07C 381/12 (2006.01)
C07C 309/01 (2006.01)

(52) U.S. Cl. .................. 430/280.1; 430/325; 430/326; 430/270.1; 430/287.1; 430/286.1; 430/281.1; 430/285.1; 430/288.1; 430/275.1; 430/945; 430/914; 430/921; 430/922; 430/925; 430/330; 430/272.1; 522/15; 522/25; 522/31; 549/59; 549/78; 549/80; 546/347; 546/348; 544/398; 562/110; 562/101; 568/34

(58) Field of Classification Search .................. 568/34; 562/101, 110; 544/398; 549/80, 59, 78; 546/347, 348; 522/15, 25, 31; 430/280.1, 430/270.1, 281.1, 286.1, 285.1, 288.1, 287.1, 430/326, 325, 300, 272.1, 275.1

See application file for complete search history.

(56) References Cited

U.S. PATENT DOCUMENTS

| | | | |
|---|---|---|---|
| 2,519,983 A | 8/1950 | Simmons | |
| 2,732,398 A | 1/1956 | Brice et al. | |
| 3,476,753 A | 11/1969 | Hansen | |
| 3,708,296 A | 1/1973 | Schlesinger | |
| 4,058,400 A | 11/1977 | Crivello | |
| 4,069,055 A | 1/1978 | Crivello | |
| 4,216,288 A | 8/1980 | Crivello | |
| 4,250,311 A | 2/1981 | Crivello | |
| 4,264,703 A | 4/1981 | Crivello | |
| 4,302,346 A * | 11/1981 | MacKinnon .................. 252/75 |
| 4,304,705 A | 12/1981 | Heilmann et al. | |
| 4,324,674 A * | 4/1982 | MacKinnon ............... 252/78.5 |
| 4,340,716 A | 7/1982 | Hata et al. | |
| 4,423,197 A | 12/1983 | Behr | |
| 4,503,211 A | 3/1985 | Robins | |
| 4,677,137 A | 6/1987 | Bany et al. | |
| 4,920,182 A | 4/1990 | Manser et al. | |
| 4,933,377 A | 6/1990 | Saeva et al. | |
| 4,957,946 A | 9/1990 | Meier et al. | |
| 4,985,340 A | 1/1991 | Palazzotto et al. | |
| 5,084,586 A | 1/1992 | Farooq | |
| 5,089,536 A | 2/1992 | Palazzotto | |
| 5,124,417 A | 6/1992 | Farooq | |
| 5,143,785 A | 9/1992 | Pujol et al. | |
| 5,215,860 A | 6/1993 | McCormick et al. | |
| 5,371,259 A | 12/1994 | Meier et al. | |
| 5,514,493 A | 5/1996 | Waddell et al. | |
| 5,554,664 A | 9/1996 | Lamanna et al. | |
| 5,565,500 A | 10/1996 | Meier et al. | |
| 5,569,784 A | 10/1996 | Watanabe et al. | |
| 5,624,787 A | 4/1997 | Watanabe et al. | |
| 5,688,884 A | 11/1997 | Baker et al. | |
| 5,731,364 A | 3/1998 | Sinta et al. | |
| 5,874,616 A | 2/1999 | Howells et al. | |
| 6,306,555 B1 | 10/2001 | Schulz et al. | |
| 6,358,665 B1 | 3/2002 | Pawlowski et al. | |
| 6,395,673 B1 * | 5/2002 | Harmer et al. ............... 502/158 |
| 6,506,535 B1 | 1/2003 | Mizutani et al. | |
| 6,740,413 B1 * | 5/2004 | Klun et al. .................. 428/421 |
| 2002/0197558 A1 | 12/2002 | Ferreira et al. | |
| 2003/0027061 A1 | 2/2003 | Cameron et al. | |

FOREIGN PATENT DOCUMENTS

| | | | |
|---|---|---|---|
| DE | 295 421 A5 | 10/1991 | |
| EP | 0 370 404 A2 | 5/1990 | |
| EP | 0 731 518 A1 | 9/1996 | |
| EP | 1 033 624 A1 | 9/2000 | |
| EP | 1 270 553 A2 | 1/2003 | |
| JP | 61-289614 A * | 12/1986 | |
| JP | 09-309874 A * | 12/1997 | |
| JP | 2001-133984 | 5/2001 | |
| JP | 2002-148821 | 5/2002 | |
| WO | WO 02/18332 A1 | 3/2002 | |
| WO | WO 02/082185 A1 | 10/2002 | |

(Continued)

OTHER PUBLICATIONS

Wu et al, "Electropolymerization of pyrrole in the presenc e of fluorinated carobylate and sulfonate salts", Journal of Fluorine Chemistry, vol. 59, 1992, pp. 311-319.*

(Continued)

Primary Examiner—Cynthia Hamilton
(74) Attorney, Agent, or Firm—Kent S. Kokko

(57) ABSTRACT

Photoacid generators (PAGs) comprising photoactive moieties and perfluorinated, multifunctional anionic moieties (or incipient anionic moieties) are disclosed which provide photoacids with high acid strength, low volatility and low diffusivity. The present invention further relates to photoacid generators as they are used in photoinitiated or acid-catalyzed processes for uses such as photoresists for microlithography and photopolymerization.

32 Claims, No Drawings

FOREIGN PATENT DOCUMENTS

WO    WO 03/040228 A1 *  5/2003

OTHER PUBLICATIONS

AN 107:50486, CA, English abstract of Morimoto et al JP 61-289614, 1 page, 1986, by Chemical Abstracts, ACS, STN database.*

RN 109203-19-2, Registry, copyright 2005, ACS on STN, one page.*

RN 109203-17-0, Registry, copyright 2005, ACS on STN, one page.*

RN 109203-21-6, Registry, copyright 2005, ACS on STN, one page.*

U.S. Appl. No. 60/281652.*

"Moiety", IUPAC Compendium of Chemical Terminology, Senod Edition (1997), one page.*

J. V. Crivello et al., "Epoxidized Triglycerides as Renewable Monomers in Photoinitiated Cationic Polymerization", Chemistry of Materials, (May/Jun. 1992), pp. 692-699, vol. 4, No. 3.

P. N. Ross, Jr., "Evaluation of Tetrafluoroethane-1,2-Disulfonic Acid as a Fuel Cell Electrolyte", Journal of the Electrochemical Society, (Apr. 1983), pp. 882-885, vol. 130, No. 4.

J. J. Krutak et al., "Chemistry of Ethenesulfonyl Fluoride. Fluorosulfonylethylation of Organic Compounds", Journal of Organic Chemistry, (Oct. 26, 1979), pp. 3847-3858, vol. 44, No. 22, American Chemical Society.

H. Ito et al., "Applications of Photoinitiators to the Design of Resists for Semiconductor Manufacturing", ACS Symposium Series 242, Polymers in Electronics, (1984), pp. 11-23, American Chemical Society, Washington, D.C.

M. Hudlicky, "Methods for Introducing Fluorine Electrochemical Fluorination Process", Chemistry of Organic Fluorine Compounds, 2$^{nd}$ (Revised Edition), (1992), pp. 73-76, Ellis Horwood, Ltd., West Sussex, England.

J.I. Kroschwitz, Editor-in-Chief, "Cationic Polymerization", Encyclopedia of Polymer Science and Engineering, 2$^{nd}$ Edition, (1985), pp. 729-814, vol. 2, John Wiley & Sons, Inc., N.Y.

J. V. Crivello et al., "Chapter III, Photoinitiators for Cationic Polymerisation", Chemistry & Technology of UV & EB Formulation for Coatings, Inks & Paints, (1998), pp. 327-478.

* cited by examiner

US 7,122,294 B2

PHOTOACID GENERATORS WITH PERFLUORINATED MULTIFUNCTIONAL ANIONS

FIELD OF THE INVENTION

The invention relates to photoacid generators (PAGs). The invention further relates to photosensitive compositions containing these photoacid generators and methods of making photosensitive compositions thereof.

BACKGROUND OF THE INVENTION

Ionic photoacid generators comprising an organic onium or organometallic cation and a non-nucleophilic counter anion have been shown to have utility as photochemically activated initiators for cationic addition polymerization in negative resists and polymer coating formulations or as similarly activatable latent acid catalysts for step-growth (or condensation) polymerization, depolymerization and the deprotection of functionalized polymers used in positive, chemically amplified photoresists. Common commercial ionic PAGs include onium and organometallic salts such as diaryliodonium and triarylsulfonium salts and (cyclopentadienyl)(arene)iron$^+$ salts of the anions $PF_6^-$, $SbF_6^-$, $CF_3SO_3^-$, $C_4F_9SO_3^-$ and $C_8F_{17}SO_3^-$. In certain cases, these same salts may also photoinitiate free-radical addition polymerization and are useful in "dual cure" applications where a mixture of cationically sensitive and free-radically polymerizable monomers are polymerized either simultaneously or sequentially. Similarly, certain classes of these salts are known to be thermally-activatable curatives for cationic, step-growth and free-radical polymerizations.

A variety of neutral photoacid generators are also known in the art and these have found utility in photoresists and curing applications where a source of photogenerated latent acid is required to catalyze or initiate secondary chemical reactions. Among the more common neutral PAGs are the sulfonate esters where a covalently bonded organic radical, A, is directly attached to a incipient sulfonate anion, $R-SO_3-A$, where R is generally an alkyl or aryl group, and may be highly fluorinated to impart high acidity to the latent sulfonic acid, $R-SO_3-H$, produced by photo-induced cleavage of the O-A bond.

The migration of semiconductor manufacturing to ever smaller feature sizes is pushing the limits of optical lithography and increasing the need for new photoresist materials that can meet the demands of more advanced lithography platforms. A critical component of photoresist formulations is the photo-acid generator or PAG. PAGs are the photoactive ingredients in photoresists that produce acid upon irradiation. In a positive resist this photoacid generally serves to catalyze deprotection of the polymeric resist, thereby altering its solubility in a developer. In a negative resist the photoacid typically initiates cationic polymerization or curing of monomeric groups, resulting in crosslinking of the resin in the irradiated areas. In both cases this process is referred to as chemical amplification, since a single photon is responsible for catalyzing or initiating multiple chemical events. Most of the PAGs currently used in semiconductor microlithography are ionic in nature, comprising a photoactive cation and a negatively charged counterion.

Organic onium salts, especially those containing iodonium and sulfonium, cations, are particularly useful as PAGs in chemically amplified photoresist applications owing to their high quantum efficiency for acid production at commonly used exposure wavelengths. In positive photoresists used in semiconductor microlithography, a number of other features and functional properties have been identified as being critical to PAG performance. These include: 1) compositions that are free of metallic or semimetallic elements (i.e., dopant elements) that can alter the electronic properties of the semiconducting substrate (e.g., silicon), 2) high photoacid strength for maximum catalytic activity and photospeed, 3) low photoacid volatility to minimize acid contamination of imaging equipment and reduce imaging defects like T-topping , 4) low photoacid diffusivity for achieving high resolution and small feature sizes, and 5) thermal stability to prevent decomposition during prebake and postbake steps.

More recently, the toxicity, environmental persistence and bioaccumulation characteristics of PAG compositions has become an important consideration in determining their commercial viability. For ionic PAGs, all of these features and properties are determined or influenced by the chemical structure of the PAG anion. The structure of the anion directly determines the identity of the photo-acid produced upon irradiation of the PAG. Differences in the size, shape, and chemical makeup of the anion, $X^-$, can lead to dramatic differences in the acidity, catalytic activity, volatility, diffusivity, solubility, and stability of the PAG or its' conjugate photo-acid, HX. These can in turn directly influence a variety of parameters related to photoresist performance, such as deblocking (or curing) efficiency, photospeed, post exposure bake (PEB) sensitivity, post-exposure delay stability, resolution, standing waves, image profiles, and acid loss (responsible for T-topping and the contamination/corrosion of exposure and processing equipment). There are currently very few PAG anions that provide both the requisite balance of properties as well as an acceptable EHS+R (environmental, health, safety and regulatory) profile for use in semiconductor photoresists. Consequently, the selection of ionic PAGs for semiconductor photoresist applications has become anion limited and there exists a pressing need within the industry for a greater selection of semiconductor-compatible PAG anions that offer desirable photoresist performance, along with safety and environmental sustainability.

Ionic PAGs have additional utility in the preparation of polymer coatings, sealants, encapsulants, and the like derived from cationically polymerizable monomers and oligomers. For many commercial applications, the polymerizable monomers are multifunctional (i.e., contain more than one polymerizable group per molecule), for example, epoxides, such as diglycidyl ethers of bisphenol A (DGEBA) and vinyl ethers, such as 1,4-cyclohexanedimethanol divinyl ether (CHVE). Mixtures of multifunctional monomers such as polyisocyanates and polyalcohols (polyols) or polyepoxides and polyalcohols can undergo acid-catalyzed polycondensation via a step-growth mechanism. Also included in this description are multireactive monomers—those that comprise two or more classes of reactive groups, such as, for instance, a monomer comprising both acrylate and isocyanate functionalites.

Compounds and materials comprising charged ions (i.e., salts) tend to have poor solubility in many organic solvents. As many useful types of compositions are based on organic systems, either organic polymer systems or organic monomer systems, reduced solubility in organic systems limits the field of utility of many ionic materials. Amongst the ionic materials that could benefit from increased solubility in organic systems are ionic PAGs (particularly those based on iodonium, sulfonium, diazonium, phosphonium and organometallic complex cations).

Synthetic modifications of the cationic portion of ionic PAGs have been made to improve their solubility in organic systems including unsymmetrical substitution of aromatic groups in aryl iodonium and sulfonium salts with different alkyl substituents. Alternatively, the use of reactive diluents or solid dispersants has also been disclosed.

The nature of the counteranion in an ionic PAG can influence the rate and extent of cationic addition polymerization. For example, J. V. Crivello, and R. Narayan, *Chem. Mater.*, 4, 692, (1992), report that the order of reactivity among commonly used nonnucleophilic anions is $SbF_6^- > AsF_6^- > PF_6^- > BF_4^-$. The influence of the anion on reactivity has been ascribed to three principle factors: (1) the acidity of the protonic or Lewis acid generated, (2) the degree of ion-pair separation in the propagating cationic chain and (3) the susceptibility of the anions to fluoride abstraction and consequent chain termination.

SUMMARY

In one aspect of the present invention, ionic photoacid generators are provided having an organic onium cation, and an anion of the formula

$$^-O_3S\text{—}R_f\text{-}Z \qquad (I)$$

where:

$R_f$ is a perfluorinated divalent alkylene moiety, cycloalkylene moiety or combinations thereof, optionally containing catenary S or N; and Z is —$SO_3^-$ or —$CO_2^-$.

In another aspect, the present invention provides photoacid generators of the formula:

$$A\text{-}O_3S\text{—}R_f\text{—}SO_3\text{—}B \qquad (II)$$

where:

$R_f$ is a perfluorinated divalent alkylene moiety, cycloalkylene moiety or combinations thereof, optionally containing catenary S or N;

A is a covalently bonded organic radical which, on exposure to actinic radiation, generates a free perfluorinated sulfonic acid moiety; and B is A or an organic onium cation.

The compounds of this invention shall be referred to as photoacid generators (PAGs) that can be activated using many different forms of energy activation, including, but not limited to photoactivation, electron beam activation, and other electromagnetic radiation activation that stimulates, activates, or releases the active species.

In another aspect, this invention relates to chemically amplified photoresist compositions that may be imaged by selective exposure to actinic radiation. The photoresist compositions comprise at least one photoacid generator of the present invention, dispersed or dissolved in a suitable resist polymer matrix. The photoresist compositions are typically utilized in the form of a thin film coating on an appropriate substrate, such as a silicon wafer and are useful, for example, in the patterning of silicon chips used in the manufacture of integrated circuits.

Photoacid generators comprising photoactive cationic moieties (or photoactive covalently bonded organic radicals) and perfluorinated, multifunctional, anionic moieties (or incipient anionic moieties) provide photoacids with high acid strength and/or very strong catalytic activity. These anions are stable, and non-nucleophilic, yet they do not contain highly toxic elements such as arsenic and antimony or semiconductor incompatible elements such as B and P.

The invention further comprises a photoresist coating composition comprising:

a) the PAG (described herein), and b) a resist polymer and, c) optionally a coating solvent The invention further provides a method of preparing an imaged photoresist coating comprising the steps of coating a substrate with a mixture of a resist polymer and the photoacid generator of the present invention, and selectively irradiating said coating to activate said photoacid generator. The method may further comprise the step of heating said irradiated coating at elevated temperatures to accelerate the chemical amplification process and effect differential solubility of said irradiated regions and the step of developing said irradiated coating to selectively dissolve soluble portions of the irradiated coating.

The invention additionally provides polymerizable compositions comprising (1) at least one of cationic addition polymerizable monomers, ethylenically-unsaturated free-radically polymerizable monomers, multifunctional or multireactive monomers polymerizable by acid-catalyzed step-growth polymerization, multifunctional or multireactive monomers polymerizable by any combination of these polymerization mechanisms, and combinations thereof; and (2) the photoacid generator of the present invention.

Advantageously, the ionic, neutral, or mixed ionic-neutral PAGs of the present invention produce multifunctional photogenerated acids that are the conjugate acids of the original PAG anions (or incipient anions) and, by virtue of their structure, having a perfluorinated organic group immediately adjacent to the sulfonic acid or carboxylic acid moiety, provide high acid strength and catalytic activity. This feature results in fast photospeeds when the photoacid generators are employed in positive or negative resist formulations and rapid cure speeds when used in polymerizable compositions. Further, the PAG anions (especially the sulfonate type anions) are stable to elevated temperatures commonly used in resist processing, and they do not contain highly toxic elements such as arsenic and antimony or semiconductor incompatible (i.e., dopant) elements such as phosphorous and boron.

Yet another advantage of PAGs of the present invention arises from the multifunctional nature of the perfluorinated anion (or incipient anion). The presence of two negatively charged groups (either two $SO_3^-$ groups or one $SO_3^-$ and one $COO^-$ group) serves to lower the volatility and diffusivity of the conjugate photoacid produced upon photolysis, compared to monofunctional analogs of similar or even greater overall molecular weight, while minimizing the chain length of the perfluorinated $R_f$ segment required to achieve these properties. Reduction in volatility and diffusivity is believed to arise from multiple hydrogen bonding interactions that are uniquely available to the difunctional photoacids.

Generally, large or high molecular weight monofunctional, perfluorinated PAG anions are preferred in today's advanced positive photoresist compositions because their conjugate acids are slow to diffuse in the resist polymer matrix and have low volatility, properties which are important to achieving high resolution and good image quality, respectively. However, it has recently been found that certain large, monofunctional perfluorinated PAG anions, such as $C_8F_{17}SO_3$-(PFOS), that provide good performance in positive resists are persistent in the environment and tend to bioaccumulate in the tissues of living organisms.

Consequently, there is a need for PAG anions that will provide performance in positive resists comparable to PFOS, while offering an improved environmental, health and safety profile. Relative to PFOS and other large, perfluorinated, monofunctional anions, certain preferred multifunctional PAG anions of the present invention of comparable or smaller size are expected to provide similarly good lithographic performance, but be more readily bioeliminated due to the relatively small size of the perfluoroalkylene segment, $R_f$, and/or their difunctional nature. These features are expected to enhance the water solubility and reduce the solubility in organics (including lipids) of PAG anions of the present invention and their conjugate photoacids. This is generally believed to mitigate absorption and retention of chemical species in living tissues. Consequently, the difunctional perfluorinated anions and their conjugate photoacids are expected to be more readily bioeliminated (eliminate from the tissues of living organisms) relative to large monofunctional perfluorinated anions, such as $C_8F_{17}SO_3^-$-(PFOS). As a result, they are expected to be relatively benign in terms of their potential impact on the environment and living organisms.

It is to be understood that the recitation of numerical ranges by endpoints includes all numbers and fractions subsumed within that range (e.g. 1 to 5 includes 1, 1.5, 2, 2.75, 3, 3.80, 4, and 5).

It is to be understood that all numbers and fractions thereof are presumed to be modified by the term "about."

It is to be understood that "a" as used herein includes both the singular and plural.

The general definitions used herein have the following meanings within the scope of the present invention.

The term "alkyl" refers to straight or branched, cyclic or acyclic hydrocarbon radicals, such as methyl, ethyl, propyl, butyl, octyl, isopropyl, tert-butyl, sec-pentyl, and the like. Alkyl groups include, for example, 1 to 12 carbon atoms, 1 to 8 carbon atoms, or 1 to 6 carbon atoms.

The term "alkenyl" refers to straight or branched unsaturated hydrocarbon radicals having one or more double bonds, such as ethylene, propylene, butylene, 1,3-pentadiene, 1,4-pentadiene, and the like. Alkenyl groups include, for example, 2 to 12 carbon atoms, or 2 to 9 carbon atoms.

The term "alkylene" refers to a divalent, straight or branched chain, cyclic or acyclic, saturated hydrocarbon radical such as, for example, —CH$_2$—, —CH$_2$CH$_2$—, —CH$_2$CH$_2$CH$_2$—, —CH$_2$CH$_2$CH(CH$_3$)CH$_2$—, —CH$_2$CH(CH$_2$CH$_3$)CH$_2$CH(CH$_3$)CH$_2$—, and the like. Alkylene groups include, for example, 1 to 20, 1 to 12, or 1 to 4 carbon atoms. Cyclic alkylene groups, or cycloalkylenes have at least 5, preferably 5 to 7, carbon atoms in the ring.

The term "aryl" refers to monovalent unsaturated aromatic carbocyclic radicals having a single ring, such as phenyl, or multiple condensed rings, such as naphthyl or anthryl.

The term "perfluoro" or "perfluorinated" refers to compounds in which essentially all carbon-bonded hydrogen atoms have been replaced by fluorine atoms, i.e. less than 1 weight percent, preferably less than 0.25 weight percent, hydrogen remains.

The term "perfluoroalkylene" refers to a fully fluorinated divalent straight or branched, cyclic or acyclic, saturated hydrocarbon radical such as, for example, —CF$_2$—, —CF$_2$CF$_2$—, —CF$_2$CF$_2$CF$_2$—, —CF$_2$CF$_2$CF(CF$_3$)CF$_2$—, —CF$_2$CF(CF$_2$CF$_3$)CF$_2$CF(CF$_3$)CF$_2$—, and the like. Perfluoroalkylene groups include, for example, 1 to 12 carbon atoms, preferably 2 to 7 carbon atoms. Cyclic perfluoroalkylene groups, or perfluorocycloalkylenes have at least 5, preferably 5 to 7, carbon atoms in the ring.

The term "weight percent" refers to the percent by mass of an individual component in a total system. For example, the weight percent of an individual monomer in a polymer is the mass of the individual monomer divided by the mass of the total polymers multiplied by 100.

In reference to PAGs, anions or photoacids of the present invention, "multifunctional" means the presence of more than one covalently linked functional group (—SO$_3^-$, —COO$^-$, —SO$_3$H, —SO$_3$-A, —SO$_3$—B and/or —COOH) per molecule.

In reference to monomers, "multifunctional" means the presence of more than one of the same functional reactive group covalently linked in a single monomer;

"multireactive" means the presence of two or more of two different functional reactive groups covalently linked in a single monomer;

"acid catalyst" or "acid catalyzed" means catalysis by a Brönsted- or Lewis-acid species; and "molecular weight" means number average molecular weight ($M_n$), unless otherwise specified.

DETAILED DESCRIPTION

The present invention provides ionic photoacid generators comprising a photochemically reactive cationic portion and a multifunctional perfluorinated anion. Upon photoactivation, the present photoacid generators generate multifunctional photoacids that are highly reactive initiators, curatives, or catalysts useful in lithographic and curing applications. The multifunctional photoacids also display reduced volatility and diffusivity in resist applications compared to related art known monofunctional photoacids, thus providing advantages in image quality and resolution. The ionic PAGs of the present invention further avoid the use of salts of toxic elements such as arsenic and antimony, or semiconductor-incompatible elements such as B and P, and are relatively inexpensive to manufacture.

Anions useful as the anionic portion of the ionic PAG salts of the present invention may be generally represented by Formula (I), respectively, and hereinafter referred to as multifunctional anions.

$$^-O_3S—R_f\text{-}Z \qquad (I)$$

where:

$R_f$ is a perfluorinated divalent alkylene moiety, cycloalkylene moiety or combinations thereof, optionally containing catenary S or N; and Z is —SO$_3^-$ or —CO$_2^-$. In applications where the thermal stability of the ionic PAG is important or maximum acidity is desired, the group Z in formula (I) is preferably SO$_3^-$.

In one embodiment, $R_f$ may be a perfluorinated divalent alkylene moiety and may contain from 1–12 carbon atoms, with 2–7 carbon atoms preferred. The $R_f$ chains may be unbranched, branched, acyclic or cyclic, and preferably are acyclic. Although not preferred, one or more non-adjacent carbon atoms in the chain may be replaced by catenary heteroatoms such as trivalent nitrogen or hexavalent sulfur.

Useful perfluoroalkylene groups are those of the formula —C$_n$F$_{2n}$—, where n is 1 to 12, preferably 2 to 7 and include, for example, linear and branched isomers of —C$_2$F$_4$—, —C$_3$F$_6$—, —C$_4$F$_8$—, —C$_5$F$_{10}$— and continuing to —C$_{12}$F$_{24}$—. Where the perfluoroalkylene groups contain hexavalent sulfur or trivalent nitrogen, one or more secondary carbon atoms, i.e. a —CF$_2$— group maybe replaced by a —SF$_4$— group or a —NR$_f'$—, wherein R$_f'$ is a perfluoroalalkyl group or a perfluorocycloalkyl group. Where the perfluoroalkylene groups contain two non-adjacent —NR$_f'$— groups, the two R$_f'$ groups may be linked to form a perfluorinated heterocyclic ring. Further, a terminal —CF$_3$ group may be replaced by a —SF$_5$ group or a —N(R$_f'$)$_2$ group, wherein each R$_f'$ is independently a perfluoroalkyl group or a perfluorocycloalkyl group. Yet further, a tertiary carbon atom, i.e. a

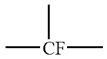

group may be replaced by a

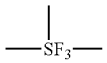

group or a

group.

Alternatively, R$_f$ may be a perfluorocycloalkylene moiety having at least 5 ring atoms, preferably having 5 or 6 ring atoms. Optionally, one or more non-adjacent ring carbon atoms may be replaced by hexavalent sulfur or trivalent nitrogen groups.

R$_f$ may further include groups that have both perfluoroalkylene and perfluorocycloalkylene groups, in addition to catenary heteroatoms, as previously described. Examples include

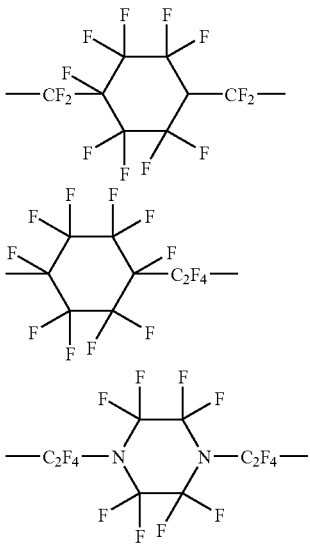

In another aspect, the present invention provides photoacid generators of the formula:

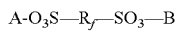

(II), where:

R$_f$ is a perfluorinated divalent alkylene moiety, cycloalkylene moiety or combinations thereof, optionally containing catenary S or N, as described for Formula (I);

A is a covalently bonded organic radical which, on exposure to actinic radiation, generates a free perfluorinated sulfonic acid moiety; and B is A or an organic onium cation, as described herein.

With respect to formula (II), the present invention provides photoacid generators having at least one, photochemically active moiety "A", of the formulas A-O$_3$S—R$_f$—SO$_3$-A and A—O$_3$S—R$_f$—SO$_3^-$B$^+$, wherein B$^+$ is an ionically bonded organic onium cation, as previously described. With respect to "A-O$_3$S—", useful photochemically active, covalently bonded moieties include those cyano-substituted oxime sulfonate esters derived from cyano-substituted oximes, N-hydroxy imide sulfonate esters, derived from N-hydroxy imides, nitrobenzyl sulfonate esters, derived from nitrobenzyl alcohols, phenyl sulfonate esters derived from phenols, and α-hydroxy sulfonyloxyketones. The photochemically active sulfonate esters may be prepared by the methods described in U.S. Pat. No. 6,855,476 (Ferreria et al. incorporated herein by reference.

Many previously known photoacid generators used in positive chemically amplified photoresists contain perfluorooctyl moieties, such as the perfluorooctanesulfonate anion (PFOS). It has been reported that certain perfluorooctyl-containing compounds may tend to bio-accumulate in living organisms; this tendency has been cited as a potential concern regarding some fluorochemical compounds. For example, see U.S. Pat. No. 5,688,884 (Baker et al.). As a result, there is a desire for fluorine-containing PAG compositions which are effective in providing desired photoresist performance, and which eliminate more effectively from the body (including the tendency of the composition and/or its degradation products).

It is expected that the preferred photoacid generators of the present invention, which contain perfluorinated multifunctional anions (or incipient anions) with relatively short perfluoroalkylene segments (<8 fluorinated carbon atoms), will more readily bioeliminate from animal tissues. It has been surprisingly found that perfluorobutylsulfonate, with four contiguous perfluorinated carbon atoms, tested in the form of its potassium salt, eliminates from the body more effectively than perfluorohexylsulfonate and much more effectively than perfluorooctylsulfonate. Similarly, screenings of the difunctional anion salts, KO$_3$S(CF$_2$)$_4$SO$_3$K and LiO$_3$S(CF$_2$)$_3$COOLi, in rats indicates that they more readily bioeliminate compared to PFOS. For this reason preferred embodiments of the R$_f$ group in Formula I and II include perfluoroalkylene groups, —C$_m$F$_{2m}$—, perfluorocycloalkylene groups, C$_m$F$_{2m-2}$, and perfluoroazaalkylene groups, containing a total of no more than 7 carbon atoms, preferably no more than 5 carbon atoms.

Representative perfluorinated, multifunctional anions of the present invention include, but are not limited to:

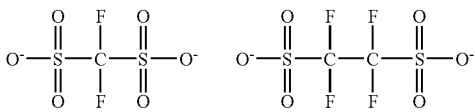

-continued

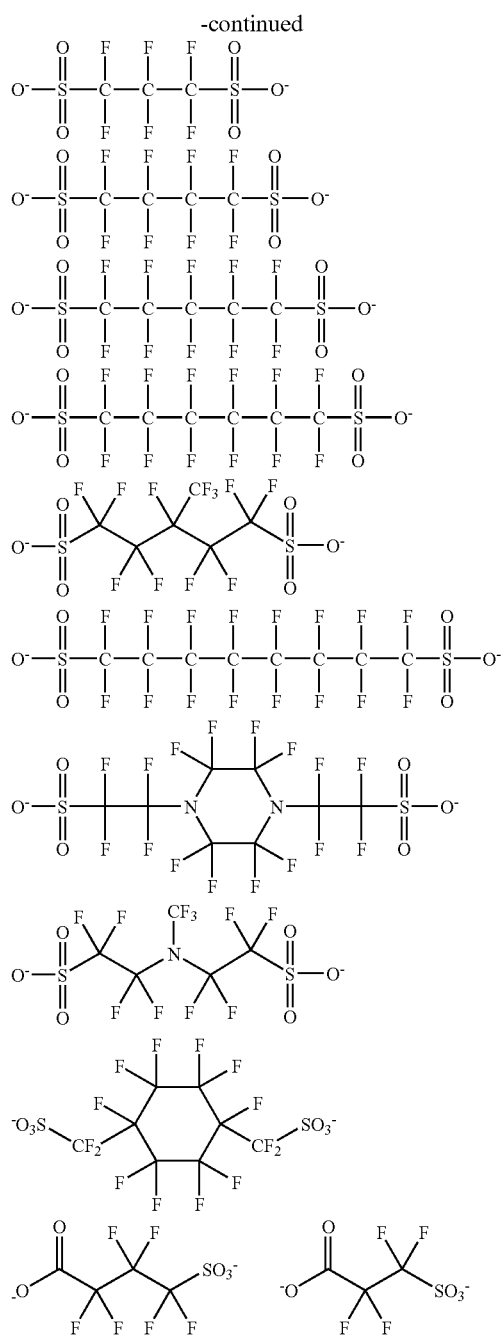

Cations useful as the cationic portion of the ionic PAGs of the invention include organic onium cations, for example those described in U.S. Pat. Nos. 4,250,311, 3,708,296, 4,069,055, 4,216,288, 5,084,586 and 5,124,417 and such descriptions incorporated herein by reference, including aliphatic or aromatic Group IVA–VIIA (CAS version) centered onium salts, preferably I-, S-, P-, Se- N- and C-centered onium salts, such as those selected from, sulfoxonium, iodonium, sulfonium, selenonium, pyridinium, carbonium and phosphonium, and most preferably I-, and S-centered onium salts, such as those selected from sulfoxonium, diaryliodonium, triarylsulfonium, diarylalkylsulfonium, dialkylarylsulfonium, and trialkylsulfonium wherein "aryl" and "alkyl" means an unsubstituted or substituted aromatic or aliphatic moiety, respectively, having up to four independently selected substituents.

The substituents on the aryl or alkyl moieties will preferably have less than 30 carbon atoms and up to 10 heteroatoms selected from N, S, non-peroxidic O, P, As, Si, Sn, B, Ge, Te, Se. Examples include hydrocarbyl groups such as methyl, ethyl, butyl, dodecyl, tetracosanyl, benzyl, allyl, benzylidene, ethenyl and ethynyl; hydrocarbyloxy groups such as methoxy, butoxy and phenoxy; hydrocarbylmercapto groups such as methylmercapto and phenylmercapto; hydrocarbyloxycarbonyl groups such as methoxycarbonyl and phenoxycarbonyl; hydrocarbylcarbonyl groups such as formyl, acetyl and benzoyl; hydrocarbylcarbonyloxy groups such as acetoxy and cyclohexanecarbonyloxy; hydrocarbylcarbonamido groups such as acetamido and benzamido; azo; boryl; halo groups such as chloro, bromo, iodo and fluoro; hydroxy; oxo; diphenylarsino; diphenylstibino; trimethylgermano; trimethylsiloxy; and aromatic groups such as cyclopentadienyl, phenyl, tolyl, naphthyl, and indenyl. With the sulfonium salts, it is possible for the substituent to be further substituted with a dialkyl- or diarylsulfonium cation; an example of this would be 1,4-phenylene bis (diphenylsufonium).

Additionally, diazonium cations such as

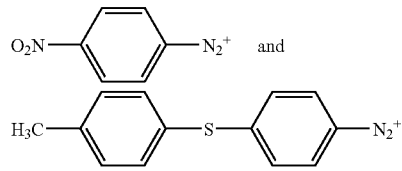

and pyridinium cations such as

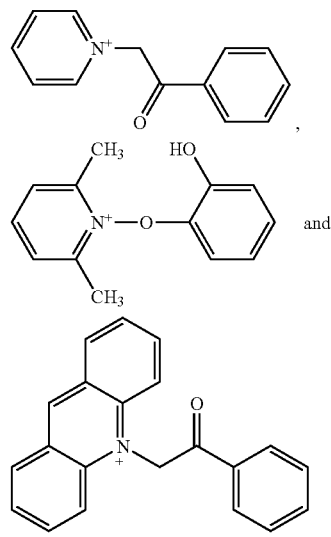

and essentially equivalent structures thereof are included.

The aromatic onium cations may be asymmetrically substituted (e.g., with various alkyl or alkoxy substituents) on the aromatic rings to improve solubility and catalytic activity.

Examples of preferred cations for use in PAG compositions of the present invention include, but are not limited to the onium cations: diphenyliodonium, ditolyliodonium, didodecylphenyliodonium, (4-octyloxyphenyl)phenyliodonium, and bis(methoxyphenyl)iodonium; triphenylsulfonium, diphenyl-4-thiophenoxyphenylsulfonium, 1,4-phenylene-bis(diphenylsulfonium); bis-(4-t-butylphenyl)-iodonium, (4-t-butyl-phenyl)-diphenyl-sulfonium, tris-(t-butyl-phenyl)-sulfonium, (4-butoxy-phenyl)-diphenylsulfonium, 1-(2-naphthalen-2-yl-2-oxo-ethyl)-tetrahydro-thiophenium, dimethyl-(2-oxo-cyclohexyl)-sulfonium, bicyclo[2.2.1]hept-2-yl-methyl-(2-oxo-cyclohexyl)-sulfonium, cyclohexyl-methyl-(2-oxo-cyclohexyl)-sulfonium, dimethyl-(2-oxo-2-phenyl-ethyl)-sulfonium, (4-hydroxy-3,5-dimethyl-phenyl)-dimethyl-sulfonium, and (4-isopropyl-phenyl)-p-tolyl-iodonium; and mixtures thereof.

In the PAGs of the present invention, each multifunctional anion (or incipient anion) is associated with a sufficient number of onium cations and/or covalently bonded organic radicals to achieve charge neutrality.

Difunctional or cyclic fluorochemical intermediates that are useful precursors for preparing the perfluorinated, multifunctional PAGs of the present invention using methods that are generally well known in the art include, but are not limited to:

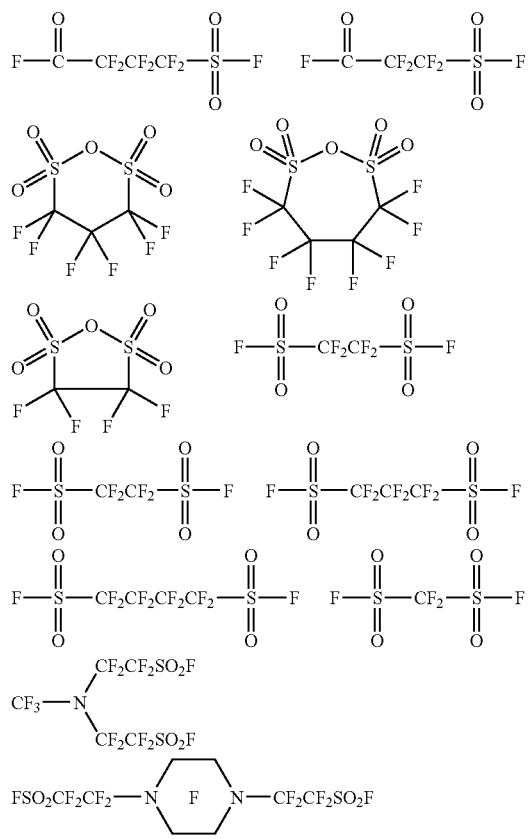

In general, ionic PAGs of the instant invention can be prepared by ion exchange or metathesis reactions by combining onium salts that contain conventional counteranions, such as chloride, bromide, acetate, triflate, $PF_6^-$, $SbF_6^-$ or $BF_4^-$, with simple alkali or alkaline earth metal salts or ammonium salts of the perfluorinated anions of the invention in a suitable solvent.

Generally, metathesis reactions may be carried out at temperatures ranging from about −80 to about 100° C., preferably at ambient temperature, under conditions in which either the PAG salt of the instant invention or the metathesis byproduct(s) selectively precipitates, thus permitting isolation of the salt of the invention in the form of a solution or a pure solid. Alternatively, ion exchange may be carried out in a mixed solvent system where one of the solvents is water and the other solvent is a non-miscible organic solvent and the ionic PAG products are separated from the byproducts of ion exchange by selective partitioning to the separate phases. Normally the ionic PAGs of the present invention partition into the organic phase and the byproduct salts partition into the aqueous phase. Separation may be achieved using a separatory funnel or similar device. Further purification may be achieved by washing the organic solution of the ionic PAG product with pure water to remove residual salt contaminants. The ionic PAG may then be isolated by stripping the organic solvent or by precipitation or recrystallizaton with a nonsolvent.

Suitable metathesis solvents generally are capable of dissolving at least one and preferably all of the reagents required for the metathesis reaction without reacting with these reagents. Solvents are generally selected such that the desired salt or the metathesis byproducts selectively precipitate, thus allowing the desired salt to be isolated in relatively pure form. Where a mixture of water and an organic solvent is used, the organic solvent is typically chosen based on its ability to selectively extract the desired ionic PAG product, while leaving the starting materials and the byproduct salts in the aqueous solution. Normally, the preferred solvent for a particular system is determined empirically. Nonlimiting examples of suitable solvents include, water; chlorocarbons, such as methylene chloride, and chloroform; ethers; aromatic hydrocarbons, such as toluene, and chlorobenzene; nitrites, such as, acetonitrile; alcohols, such as methanol and ethanol; nitrobenzene; nitromethane; ketones, such as acetone and methyl ethyl ketone; and other similar classes of organic solvents. Mixtures of solvents are often desirable to control solubility of reagents and product salts. The PAG salts of the invention will form in situ if the individual PAG precursors described supra are added directly to the polymerizable or resist composition and a suitable solvent or diluent, including monomer, is used. It is preferred, however, to form the pure catalyst or initiator in a separate step as a solid or in a suitable solvent prior to adding the same to the polymerizable or resist composition and performing the photochemical process.

PAGs derived from the above described anions and cations (or covalently bonded organic radicals) may be activated by radiation or may require two stage activation involving radiation followed by heat. Suitable PAGs having photoactivatable groups and a perfluorinated multifunctional anion (or incipient anion) for use in the polymerizable or resist compositions of the instant invention are those that upon application of sufficient energy; accelerated particle (electron beam, ion beam), or electromagnetic radiation sources employing x-ray, extreme-UV, deep-UV, mid-UV near-UV and visible radiation will generate an acid species capable of initiating or catalyzing the desired polymerization, depolymerization, or deblocking chemistry. The level of photocatalyst or initiator activity, and the preferred wavelength of actinic radiation will of course depend on the choice of cation, photoactive covalently bonded organic radical and multifunctional anion (or incipient anion) in the PAG and on the monomer or resist system chosen.

The present invention provides chemically amplified photoresist compositions that may be imaged by selective exposure to actinic radiation. The photoresist compositions comprise photochemically active PAGs of the perfluorinated, multifunctional anions (or incipient anions), described above, dispersed or dissolved in a suitable resist polymer matrix. Optionally a coating solvent may also be present.

The photoresist compositions are typically utilized in the form of a thin film coating on an appropriate substrate, such as a silicon wafer, various metal clad substrates used in manufacturing circuit boards or a metal printing plate. Chemically amplified resist systems based upon acid catalyzed chain reactions (e.g., polymerization, depolymerization, side-chain cleavage, etc.) are recognized in the art as a preferred class of resist systems for micro- or nanolithography due to the high spectral sensitivity provided by the acid-catalyzed or initiated chemical amplification mechanism, and the insensitivity of such systems to oxygen, a common inhibitor of free radical processes.

Radiation sensitive compositions called chemically amplified photoresists are advantageous in that the catalytic imaging process can provide high photosensitivity. By virtue of their high photosensitivity and high resolution, chemically amplified photoresists are being utilized in most state of the art or next generation microlithography systems. Chemically amplified photoresists comprise a radiation sensitive, photoacid generator (PAG) that acts as a latent source of photogenerated acid. Upon exposure to actinic radiation, the photoacid generator releases an acid that subsequently catalyzes a chemical reaction in the surrounding medium in which the PAG is dissolved, generally an acid sensitive polymer. If the solubility of the photoresist increases as a result of exposure to radiation, it is termed a positive resist; if the solubility decreases it is termed a negative resist. Today's most common positive resists generally function by acid catalyzed cleavage of acid-sensitive protecting (or blocking) groups attached to a polymer chain, which, once removed, render the polymer soluble in developer. Negative resists generally involve an acid catalyzed or initiated crosslinking reaction that renders the composition insoluble, usually via polymerization of pendant monomeric groups.

More specifically, positive-working chemically amplified photoresists generally contain two-components comprising (i) a polymeric resin which has been rendered insoluble in alkaline solutions by masking at least a part of the water soluble groups on the resin with an acid cleavable protecting group and (ii) a photoacid generator. Other materials can be optionally added to improve lithographic performance such as bases and dissolution inhibitors. Upon exposure to actinic radiation, the photoacid generator produces a strong acid capable of catalytically cleaving the bond between the protecting groups and the resin, resulting in the formation of an alkali-soluble resin. A single photogenerated acid molecule is able to cleave a large number of protecting groups from the resin, thus contributing to the high sensitivity of chemically amplified positive photoresists.

Negative working photoresists generally contain a crosslinking agent or a polymerizable group linked to a soluble polymer or oligomer. The acid produced from exposure of the photoacid generator causes the exposed area to become crosslinked and therefore insoluble in developer.

The photoresist films are generally coated from a photoresist solution comprising the PAG, the resist polymer and a coating solvent using solution-coating techniques, such as spin coating. Coating solvents that may be used to prepare thin film photoresist compositions of the present invention include, but are not limited to, propylene glycol methyl ether acetate (PGMEA), ethyl lactate, ethyl acetate, cyclohexanone, and supercritical or liquid carbon dioxide. After coating the photoresist composition onto a substrate, a pre-exposure bake step is generally employed to anneal the film and remove residual coating solvent.

Selective irradiation of the photoresist coating is typically achieved by exposure through a mask, although other selective irradiation techniques may also be employed, such as laser writing. Upon irradiation, the photoactive PAGs undergo photochemical decomposition to produce a mixture of highly reactive products, including strong acid and free radicals.

Suitable polymers useful as photoresist matrix materials (or binders) contain functional groups that are reactive towards the photochemically produced acid or free-radicals. The polymer functional groups generally undergo secondary, non-photochemical chain reactions with these highly reactive species, a chemical amplification process that ultimately alters the solubility or volatility of the polymer in the irradiated regions.

Photoresist compositions that increase in solubility (or volatility) upon exposure to actinic radiation are termed positive photoresists, whereas, those that decrease in solubility are termed negative photoresists. Changes in solubility can result, for example, from radical- or acid-induced crosslinking of the polymer, as in a negative photoresist, or from acid-catalyzed cleavage of polymer functional groups and conversion of the polymer to a more soluble or volatile form, as in a positive photoresist. These secondary reactions may occur under ambient conditions or in a post-exposure bake step carried out at elevated temperatures. When carried out under the proper conditions, the differential solubility produced in the irradiated and non-irradiated portions of the polymer is sufficient to allow selective dissolution of only the more soluble portions of the exposed photoresist layer using a developer solution, thus creating a relief image. Developer solutions may be organic or aqueous based mixtures or solutions, but typically comprise a dilute solution of aqueous base. Alternatively, the acid-catalyzed cleavage of functional groups in the main backbone of a polymer chain may produce only low molecular weight, volatile products which are liberated from the irradiated regions under appropriate conditions, thus negating the need for post-exposure development with solvents.

For semiconductor photoresist applications, ionic photoacid generators containing organic onium cations are preferred over the ionic photoacid generators containing organometallic complex cations because metal-containing organometallic complex cations may introduce unwanted metal contaminants into the semiconductor chip manufacturing process.

Chemically amplified resist systems based upon acid catalyzed chain reactions (e.g., polymerization, depolymerization, side-chain cleavage, etc.) are recognized as a preferred class of resist system for micro- or nanolithography due to the high spectral sensitivity provided by the acid-catalyzed or initiated chemical amplification mechanism and the insensitivity of such systems to oxygen, a common inhibitor of free radical processes. It is also recognized that positive-working photoresists are generally capable of providing better image resolution than negative working photoresists and are therefore preferred in applications where very fine-line image resolution is required, as in the manufacture of semiconductor devices.

Polymers useful as matrix materials for photoresists of the present invention may be chosen from any of a wide variety of polymer structures possessing functional groups that are reactive with acid or free radicals. The functional groups may be present as pendant groups attached to the polymer chain, terminal end-groups, or may be contained within the polymer backbone itself. Common free radical- or acid-polymerizable functional groups useful in preparing negative photoresists which crosslink upon exposure include but are not restricted to epoxy groups, alcohol groups, acrylate groups, acrylamide groups, vinyl ether groups, olefinic groups, vinyl amine groups, cyclic ether groups, cyclic ester groups, cyclic carbonate groups, cyclic acetal groups, oxazoline groups, alkoxysilane groups, cyclosiloxane groups and mixtures thereof. Acid labile functional groups that are useful in the preparation of positive photoresists include but are not restricted to ester groups (especially t-butyl esters, t-adamantyl esters, secondary allylic esters, secondary beta-ketoesters, alpha-tetrahydropyran esters and alpha-tetrahydrofuran esters), carbonate groups (especially t-butyl carbonates), silyl ether groups, acetal and ketal groups, and ether groups (especially t-butyl ethers). Positive photoresists may also be obtained by incorporating low molecular weight, acid labile dissolution inhibitors such as t-butylcholate into a resin matrix.

Polymer backbones useful in photoresist compositions of the present invention span a wide range of structural types and are usually chosen based upon the particular balance of optical, chemical and physical properties desired for a given application. Important considerations in choosing a suitable polymer backbone include optical clarity, transmittance at the irradiating frequency, refractive index, adhesion to the substrate, plasma etch resistance, solubility and film forming characteristics. Polymer backbones commonly employed in photoresist applications and suitable for use in the present invention include, but are not restricted to, polyphthaldehyde, polyacrylates, polymethacrylates, polystyrenes, polycycloolefins (including polymers derived from radical, ROMP and transition metal-catalyzed addition polymerization of norbornene and related polycyclic olefins), polycycloolefin-maleic anhydride copolymers, copolymers of fluoroolefins with cycloolefins, and phenol-formaldehyde condensation polymers. Various copolymers of the above named homopolymers can also be used.

Resist compositions of this invention may be applied, preferably as a liquid, to a substrate such as a silicon wafer, steel, aluminum, copper, cadmium, zinc, ceramic, glass, paper, wood or various plastic films such as poly(ethyleneterephthalate), plasticized poly(vinylchloride), polypropylene, polyethylene, polyimide, and the like, and irradiated and/or heated. By chemically altering the solubility of part of the coating, as by irradiation through a mask followed by a post exposure bake step, those sections that are soluble may be washed away with a solvent (or developer) while leaving the insoluble portions in place. Thus, PAG-containing resist compositions of this invention may be used in the production of articles useful in the graphic arts, recording, and electronics industries, such as integrated circuit chips, printing plates, data storage media, printed circuits, and photoimageable electronic packaging.

A variety of additives and adjuvants may be added to positive and negative resist compositions of the invention to improve resist performance, including sensitizers, dissolution inhibitors, surfactants, leveling agents, bases or acid scavengers and stabilizers. Art-known PAGs, either neutral or ionic, may also be used in combination with the ionic PAGs of the present invention in order to optimize the lithographic performance of photoresist compositions of the instant invention.

In the radiation sensitive resist compositions of this invention, the photoacid generators can be present in a catalytically effective amount to initiate polymerization (for negative photoresists) or depolymerization or deblocking (for positive photoresists), and is generally in the range of 0.01 to 20 wt. %, preferably 0.1 to 10 wt. %, most preferably 1 to 5 wt. % of the total polymeric resin composition; i.e., the total composition excluding any solvent that may be present.

The present invention also provides polymerizable coating compositions comprising (1) at least one of cationically polymerizable monomers, ethylenically-unsaturated free radically polymerizable monomers, multifunctional or multi-reactive monomers polymerizable by acid-catalyzed step-growth polymerization, multifunctional or multi-reactive monomers polymerizable by any combination of these polymerization mechanisms, or mixtures thereof and (2) a PAG of the present invention.

The present invention also provides a method for the polymerization comprising the steps of:

(a) providing a monomer mixture comprising at least one of cationically polymerizable monomer, an ethylenically-unsaturated free radically polymerizable monomer, or multifunctional or multi-reactive monomers polymerizable by acid-catalyzed step-growth polymerization, or multifunctional or multi-reactive monomers polymerizable by any combination of these polymerization mechanisms, and mixtures thereof, and a catalytically effective amount of a curing agent to the monomer mixture wherein the curing agent comprises at least one of the PAGs of the instant invention (and all permutations of the order of mixing the aforementioned components), thereby forming a polymerizable composition, and (b) polymerizing the mixture composition with a sufficient amount of actinic radiation.

The present invention further provides a method for preparing coated articles containing the cured composition of the invention comprising the steps of:

(a) providing a substrate, (b) coating an energy polymerizable composition of the invention, as described above, onto at least one surface of the substrate by methods known in the art, such as bar, knife, reverse roll, knurled roll, curtain, or spin coating, or by dipping, spraying, brushing, and the like, with or without a coating solvent, and (c) applying energy (after evaporation of solvent, if necessary) to the coating and, if desired, to the article to cause the polymerization of the coating.

It may be desirable to add solvent to solubilize components and aid in processing. Solvent, preferably organic solvent, may be present in an amount up to 99 weight percent, preferably in the range of 0 to 90 weight percent, and most preferably in the range of 0 to 75 weight percent, of the total composition.

To prepare a structural/semi-structural epoxy adhesive, the curable composition could contain additional adjuvants such as silica fillers, glass bubbles and tougheners. These adjuvants add toughness to and reduce the density of the cured composition. Generally shorter chain polyols would be used to give toughness through chain extension of the cured epoxy. Too long a chain diol generally would produce too soft a cured composition that would not have the strength needed for structural/semi-structural applications. Using polyols having high hydroxyl functionality (e.g., greater than three) could produce an over-crosslinked material resulting in a brittle adhesive.

To prepare magnetic media using the materials of the present invention, magnetic particles must be added to the curable composition. Magnetic media need to be coated onto a suitable substrate, generally a polymeric substrate like polyester. Generally the coatings are very thin so that sufficient carrier solvent must be added to allow the production of a suitably thin, even coating. The coating must cure rapidly so a fast initiator system and curable materials must be chosen. The cured composition must have a moderately high modulus so the curable materials must be selected appropriately.

To prepare protective coatings, the choice of materials depends on the needs of the specific application. Abrasion resistant coatings are generally hard and require a significant portion of the formulation to be a hard resin, which are generally short chain length and have high functionality. Coatings undergoing some flex require toughness that can be obtained by lowering the crosslink density of the cure formulation. Clear coatings require the cured resins to have little to no phase separation. This obtained by controlling the compatibility of the resins or controlling phase separation by cure rate. Adjuvants could be added to these coating formulations in an amount effective for their intended use.

In the polymerizable compositions of this invention, the photoacid generators can be present in a catalytically effective amount to initiate polymerization, and is generally in the range of 0.01 to 20 weight percent (wt %), preferably 0.1 to 10 wt % of the overall polymeric resin composition; i.e., the total composition excluding any solvent that may be present.

A wide variety of monomers can be energy polymerized using the photoacid generators of the invention. Included are monomers selected from the group consisting of cationically polymerizable monomers, free-radically-polymerizable monomers, and acid-catalyzed step-growth polymerizable monomers. Preferred monomers are acid-catalyzed step-growth polymerizable monomers and cationically polymerizable monomers, with the more preferred monomers being the cationically polymerizable monomers.

Suitable cationically polymerizable monomers and/or oligomers typically contain at least one cationically polymerizable group such as epoxides, cyclic ethers, vinyl ethers, vinylamines, side-chain unsaturated aromatic hydrocarbons, lactones and other cyclic esters, lactams, oxazolines, cyclic carbonates, cyclic acetals, aldehydes, cyclic amines, cyclic sulfides, cyclosiloxanes, cyclotriphosphazenes, certain olefins and cycloolefins, and mixtures thereof, preferably epoxides and vinyl ethers. Other cationically polymerizable groups or monomers described in G. Odian, "Principles of Polymerization" Third Edition, John Wiley & Sons Inc., 1991, NY. and "Encyclopedia of Polymer Science and Engineering," Second Edition, H. F. Mark, N. M. Bikales, C. G. Overberger, G. Menges, J. I. Kroschwitz, Eds., Vol. 2, John Wiley & Sons, 1985, N.Y., pp. 729–814 are also useful in the practice of the present invention.

Particularly useful examples include cyclic ether monomers, including epoxide monomers described in U.S. Pat. No. 4,985,340 and such description is incorporated herein by reference. A wide variety of commercial epoxy resins are available and listed in "Handbook of Epoxy Resins" by Lee and Neville, McGraw Hill, New York (1967) and in "Epoxy Resin Technology" by P. F. Bruins, John Wiley & Sons, New York (1968). Preferably, when used in conductive adhesives, the epoxy resins are "electronic grade," that is, low in ionic contaminants.

Useful epoxy resins can include propylene oxide, epichlorohydrin, styrene oxide and epoxies based upon bisphenol A, such as, EPON-828-LS™ electronic grade epoxy resins available from Shell Chemicals, or novolac epoxies, such as, EPON-164™ (also available from Shell Chemicals) or their equivalents from other manufacturers. Additional useful epoxy resins include dicylopentadiene dioxide, epoxidized polybutadiene such as the Poly BD™ resins available from Elf Atochem, 1,4-butanediol diglycidyl ether, and resorcinol diglycidyl ether. Also useful are the cycloaliphatic epoxies, such as cyclohexene oxide and the ERL™ series of resins available from Union Carbide, such as vinylcyclohexene dioxide (ERL-4206™), 3,4-epoxycyclohexylmethyl-3,4-epoxycyclohexanecarboxylate (ERL-4221™), bis(3,4-epoxy-6-methylcyclohexylmethyl)adipate (ERL-4299™); 1,4-butanediol diglycidyl ether, (for example, Heloxy 67™ available from Shell Chemical), polyglycidyl ether of phenol-formaldehyde novolak (e.g., DER-431™ and DER-438™, available from Dow Chemical Co., polyglycol diepoxide (e.g., DER 736™, available from Dow Chemical Co.), and mixtures thereof as well as mixtures thereof with co-curatives, curing agents or hardeners that also are well known. Representative of these well-known co-curatives or hardeners that can be used are acid anhydrides such as maleic anhydride, cyclopentanetetracarboxylic acid dianhydride, pyromellitic anhydride, cis-1,2-cyclohexanecarboxylic acid anhydride, and mixtures thereof.

Epoxy resins preferred for use in conductive adhesives are the glycidyl ether type of resins, particularly in formulations where stabilizers are present.

When preparing compositions containing epoxy monomers, hydroxy-functional materials can be added. The hydroxyl-functional component can be present as a mixture or a blend of materials and can contain mono- and poly-hydroxyl containing materials. Preferably, the hydroxyl-functional material is at least a diol. When used, the hydroxyl-functional material can aid in chain extension and preventing excess crosslinking of the epoxy during curing, e.g., increasing toughness of the cured composition.

When present, useful hydroxyl-functional materials include aliphatic, cycloaliphatic or alkanol-substituted arene mono- or poly-alcohols having from about 2 to about 18 carbon atoms and two to five, preferably two to four hydroxy groups, or combinations thereof. Useful mono-alcohols can include methanol, ethanol, 1-propanol, 2-propanol, 2-methyl-2-propanol, 1-butanol, 2-butanol, 1-pentanol, neopenyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol and tetrahydrofurfuryl alcohol.

Polyols useful in the present invention include aliphatic, cycloaliphatic, or alkanol-substituted arene polyols, or mixtures thereof having from about 2 to about 18 carbon atoms and two to five, preferably two to four hydroxyl groups.

Examples of useful polyols include 1,2-ethanediol, 1,2-propanediol, 1,3-propanediol, 1,4-butanediol, 1,3-butanediol, 2-methyl-1,3-propanediol, 2,2-dimethyl-1,3-propanediol, 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethlene glycol, triethylene glycol, tetraethylene glycol, glycerine, 2-ethy-2-(hydroxymethyl)-1,3-propanediol, 2-ethyl-1,3-pentanediol, 1,4-cyclohexanedimethanol, 1,4-benzenedimethanol, and polyalkoxylated bisphenol A derivatives. Other examples of useful polyols are disclosed in U.S. Pat. No. 4,503,211.

Higher molecular weight polyols include the polyethylene and polypropylene oxide polymers in the molecular weight ($M_n$) range of 200 to 20,000 such as the Carbowax™ polyethyleneoxide materials available from Union Carbide, caprolactone polyols in the molecular weight range of 200 to 5,000 such as the Tone™ polyol materials available from Union Carbide, polytetramethylene ether glycol in the molecular weight range of 200 to 4,000, such as the Terathane™ materials available from DuPont, polyethylene glycol, such as PEG 200 available from Union Carbide, hydroxyl-terminated polybutadiene resins such as the Poly BD™ materials available from Elf Atochem, phenoxy resins, such as those commercially available from Phenoxy Associates, Rock Hill, S.C., or equivalent materials supplied by other manufacturers.

Cationically-polymerizable vinyl and vinyl ether monomers are also particularly useful in the practice of this invention and are described in U.S. Pat. No. 4,264,703, and such description is incorporated herein by reference.

Suitable free-radically polymerizable compounds containing at least one ethylenically unsaturated double bond, may be monomers and/or oligomers, such as (meth)acrylates, (meth)acrylamides, and other vinyl compounds capable of undergoing free-radical polymerization. Such monomers and specific examples are more fully described in U.S. Pat. No. 4,985,340, and such description is incorporated herein by reference.

Such monomers include mono-, di-, or polyacrylates and methacrylates such as methyl acrylate, methyl methacrylate, ethyl acrylate, isopropyl methacrylate, isooctyl acrylate, acrylic acid, n-hexyl acrylate, 2-ethylhexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol dimethacrylate, 1,6-hexanediol diacrylate, trimethylolpropane triacrylate, 1,4-cyclohexanediol diacrylate, pentaerythritol triacrylate,-tetraacrylate and -tetramethacrylate, the bisacrylates and bis-methacrylates of polyethylene gycols of molecular weight 200–500; multi-reactive monomers such as epoxy (meth)acrylates, isocyanatoalkyl (meth)acrylates such as isocyanatoethyl (meth)acrylate, hydroxyalkyl (meth)acrylates, such as hydroxyethyl- and hydroxypropyl (meth)acrylates, acrylated epoxies, such as ethoxylated bisphenol A di(meth)acrylate, glycidyl (meth)acrylate; unsaturated amides such as acrylamide, methylene bisacrylamide and β-methacrylaminoethyl methacrylate; and vinyl compounds such as styrene, divinylbenzene, divinyl adipate and various vinyl azlactones as are disclosed in U.S. Pat. No. 4,304,705. Mixtures of more than one monomer can be used as desired.

Acid-catalyzed step growth polymerizations include, but are not limited to, the reaction of multifunctional isocyanates (polyisocyanates) with multifunctional alcohols (polyols) to form polyurethanes, the reaction of multifunctional epoxies with multifunctional alcohols, and the cyclotrimerization of multifunctional cyanate esters to crosslinked polytriazine resins.

Particularly useful multifunctional alcohol, isocyanate, and epoxide components that can be cured by acid-catalyzed step-growth polymerization using catalysts of the present invention are described in U.S. Pat. Nos. 4,985,340, 4,503,211 and 4,340,716, and such description is incorporated herein by reference.

Suitable multifunctional cyanate esters that can be cured by catalyzed cyclotrimerization, using catalysts of this invention are described in U.S. Pat. Nos. 5,143,785 and 5,215,860 and such description is incorporated herein by reference.

Suitable multireactive monomers that can be cured by catalysts of the invention include glycidyl (meth)acrylate, hydroxy(alkyl) (meth)acrylates such as hydroxyethyl acrylate, isocyanatoethyl methacrylate, and the like.

When mixtures of more than one polymerizable monomer are used, the polymerizable components can be present in any proportion preferably with the minor component comprising at least 1.0 wt %.

Mixtures of aforementioned classes of monomers with additives such as tackifiers, hardeners, co-curatives, curing agents, stabilizers, sensitizers etc. can also be used in the polymerizable compositions of this invention. Furthermore, adjuvants, such as pigments, abrasive granules, stabilizers, light stabilizers, antioxidants, flow agents, bodying agents, flatting agents, colorants, inert fillers, binders, blowing agents, fungicides, bacteriocides, surfactants, plasticizers, and other additives as known to those skilled in the art can be added to the compositions of this invention. These can be added in an amount effective for their intended purpose, as long as they do not interfere with the polymerization of the compositions of the invention. Additionally, in compositions containing radiation-sensitive catalysts or initiators it is preferable that the adjuvants do not absorb radiation to which the catalysts or initiators are responsive.

Stabilizing additives useful in the compositions are described in detail in U.S. Pat. No. 5,554,664 (Lamanna et al.), and are incorporated herein by reference.

Solvents, preferably organic, can be used to assist in dissolving the curing agent in the polymerizable monomers described supra and as a processing aid. Representative solvents include acetone, methyl ethyl ketone, cyclopentanone, methyl cellosolve acetate, methylene chloride, nitromethane, methyl formate, acetonitrile, gamma-butyrolactone, 1,2-dimethoxyethane (glyme), 3-methyl sulfolane, and propylene carbonate. In some applications it may be advantageous to adsorb the curing agents onto an inert support such as silica, alumina, clays, etc., as described in U.S. Pat. No. 4,677,137.

In general, energy-induced polymerization of the polymerizable compositions of this invention, which incorporate a latent, light or radiation sensitive catalyst or initiator, (i.e. PAG) may be carried out at room temperature for the majority of energy curable compositions, although low temperature (e.g., −10° C.) or elevated temperature (e.g., 30° to 400° C., preferably 50° to 300° C.) can be used to subdue the exotherm of polymerization or to accelerate the polymerization, respectively. Temperature of polymerization and amount of catalyst will vary and be dependent on the particular curable composition used and the desired application of the polymerized or cured product. The amount of curing agent (ionic PAG) to be used in this invention should be sufficient to effect polymerization of the monomers (i.e., a catalytically effective amount) under the desired use conditions. Such amount generally will be in the range of about 0.01 to 20 wt %, and preferably 0.1 to 10 wt %, based on the weight of the curable composition. For purposes of this calculation, "curable composition" means the composition including all monomers, activators/initiators, additives, adjuvants, sensitizers and other non-solvent components of the polymerization mixture.

To activate radiation sensitive compositions of the present invention, any source of radiation including accelerated particles (e.g., electron beam or ion beam radiation), x-ray, extreme-UV, deep-UV, mid-UV near-UV and visible radiation can be used. Suitable sources of radiation include fluorescent lamps, mercury vapor discharge lamps, carbon arcs, tungsten lamps, xenon lamps, various lasers and laser sources, e-beam sources, ion beam sources, sunlight, etc. The required amount of exposure to activate the PAG and drive the chemical amplification process is dependent upon such factors as the identity and concentrations of the PAG, the particular monomers or functional polymers present, the temperature and thickness of the exposed material, the type of substrate, the intensity of the radiation source and the amount of heat associated with the radiation.

It has been noted that photoacid generators of the present invention can provide exceptionally strong catalytic activity when activated as compared to other commonly known catalyst and photocatalyst systems. This is particularly true where monomers polymerizable by cationic addition polymerization or acid-catalyzed step-growth polymerization are used and in high activation energy photoresists which require strong acid photocatalysts.

The features and advantages of the present invention are further illustrated by the following examples, but the particular materials and amounts thereof recited in these examples, as well as other conditions and details, should not be construed to unduly limit this invention. All materials are commercially available or known to those skilled in the art unless otherwise stated or apparent.

EXAMPLES

Glossary

| Descriptor | Description/Formula/Structure | Availability |
|---|---|---|
| DTBPI-ONf | $[(CH_3)_3C-C_6H_4-]_2I^+$ $C_4F_9SO_3^-$ | Daychem, Dayton, OH |
| DTBPI-PFOS | $[(CH_3)_3C-C_6H_4-]_2I^+$ $C_8F_{17}SO_3^-$ | Daychem |
| DTBPI-OAc | $[(CH_3)_3C-C_6H_4-]_2I^+$ $CH_3CO_2^-$; high purity sample | Daychem |
| EPON™ 828 | Bisphenol A diglycidyl ether | Shell Chemical, |
| ERL-4221 | (cycloaliphatic diepoxide structure) | Union Carbide, Danbury, CT |
| $FSO_2(CF_2)_3COF$ | 4-(fluorosulfonyl)hexafluorobutyryl fluoride | Can be prepared as described in U.S. Pat. No. 2,732,398 |
| $(C_6H_5)_3S^+Br^-$ | Triphenylsulfonium bromide; high purity sample | Daychem |
| ITX | isopropyl thioxanthone | Sigma-Aldrich |
| KF | Potassium fluoride; spray dried (99%) | Sigma-Aldrich |
| PGMEA | DOWANOL™ PMA; propylene glycol methyl ether acetate; $CH_3CO_2CH(CH_3)CH_2OCH_3$ | Dow Chemical, Midland, MI |
| VEX 5015 | Vinyl ether | Allied Signal |

Analysis Methods

NMR $^1H$ and $^{19}F$ NMR spectra were acquired using a Varian UNITY plus 400 FT-NMR spectrometer operating at 400 MHz for $^1H$ and 376 MHz for $^{19}F$. Either p-bis(trifluoromethyl)benzene or 2,2,2-trifluoroethanol were used as cross integration standards in the quantitative NMR analysis of PAG samples.

Thermal Gravimetric Analysis (TGA)

TGA was performed on a Perkin-Elmer Instruments TGA Model 7 in an open platinum pan. The onset of thermal decomposition, $T_d$, was taken as the thermal decomposition temperature of the photoacid generators and was determined under nitrogen atmosphere using a temperature ramp of 10° C. per minute. The onset temperature was determined by the intersection of tangents to the low temperature portion of the baseline and the first inflection point in the wt % vs. temperature curve.

Differential Scanning Calorimetry (DSC)

DSC was performed on a Perkin-Elmer Instruments DSC Model 7 using standard crimped aluminum pans on neat samples. Melting points, m.p., of the photoacid generators were determined by DSC under a nitrogen atmosphere using a temperature ramp of 20° C. per minute. The peak maximum of the highest temperature endotherm was taken to be the melting point Photo-DSC/DSC: Standard (hermetic) liquid sample pans were used. Sample size was kept in the 6 to 8 mg range. Samples were tested using a Dupont Photo-DSC/DSC instrument (available from DuPont, Wilmington, Del.). The light source was a 200 W Hg lamp that delivered about 60 mw/cm at the sample. Samples were exposed in open pans for 5 minutes to the light source at 30° C. then removed from the instrument, sealed and a standard DSC scan run at 10° C./minute to 300° C. A separate DSC experiment was carried out using a sealed sample pan and no prior light exposure to determine the dark reactivity of these PAGs. Comparison of the DSC traces before and after light exposure enables differentiation between the thermal reactivity of the PAGs (in the dark) and their photochemical activity.

Preparation of Precursor 1: $LiO_3S(CF_2)_3SO_3Li$:

A 500 mL, three-necked flask equipped with a mechanical stirrer, thermometer, condenser and addition funnel was charged with $LiOH.H_2O$ (53.091 g), and deionized water (275 mL) and heated to 60° C. Hexafluoro-1,3-propanedisulfonylfluoride (80.00 g) was slowly added over a one hour period with stirring and the ensuing stirred mixture was held at 60° C. overnight. The mixture was then cooled to room temperature and transferred to a 1.0 L Erlenmeyer flask and treated with excess dry ice, with stirring, to convert unreacted LiOH to $Li_2CO_3$. Celite™ was added to the resulting slurry, which was then removed via filtration through a sintered glass frit.

The filtrate was evaporated to dryness in a convection oven at 90° C. The resulting solid was further dried at 135° C. in a vacuum oven at about 50 Torr. The solid was then taken up in 500 mL of ethanol and filtered by suction through a 0.1 micron pore size Nylon filtration membrane. Undissolved solid in the filter cake was washed with two 150 mL portions of ethanol and the combined filtrates were evaporated to dryness on a rotary evaporator at 30–80° C. and 20 Torr yielding a clear, viscous oil. The oil was twice treated with 200 mL portions of toluene and then evaporated to dryness at 50–90° C., 20 Torr on a rotary evaporator to remove traces of ethanol and water. The resulting white solid was further dried in a vacuum oven at 120° C., $10^{-2}$ Torr to yield 79.1 g (96% yield) of white powder. Characterization by $^{19}F$ NMR spectroscopy at 254 MHz, showed it to be of comprised of 99.3% (by wt.) $LiO_3S(CF_2)_3SO_3Li$ (99.3%) and $LiO_3SCF_2CF(CF_3)SO_3Li$ (0.7%).

Preparation of Precursor 2: $KO_3S(CF_2)_4SO_3K$:

Precursor 2 was prepared according to the procedure described in U.S. Pat. No. 4,423,197, Example 1, except that $FO_2S(CF_2)_3SO_2F$ is replaced with equimolar amount of $FO_2S(CF_2)_4SO_2F$. Characterization by $^{19}F$ NMR spectroscopy at 376 MHz, showed it to be comprised of $KO_3S(CF_2)_4SO_3K$ (99.31%), KF (0.53%), and $KO_3SCF_2CF_2CF(CF_3)SO_3K$ (0.043%).

Preparation of Precursor 3: $CF_3N(CF_2CF_2SO_3Li)_2$:

A 500 mL flask equipped with an addition funnel, magnetic stir bar and reflux condenser was charged with isopropanol (200 mL) and $CF_3N(CF_2CF_2SO_2F)_2$ (11.4 g; prepared by electrochemical fluorination of methylamino bis-ethyl sulfonyl fluoride which, in turn, was prepared by double addition of methyl amine to vinylsulfonyl fluoride as described in Krutak et al., J. Org. Chem., 44(2):3847–58 (1979)). To the resulting two-phase mixture was added LiOH (180 mL; 1M aq) in two aliquots. The resulting mixture was then stirred at room temperature overnight, after which it was evaporated to dryness under reduced pressure. The remaining white solid was extracted with diethyl ether (500 mL), followed by tetrahydrofuran (300 mL). The combined extracts were then evaporated under reduced pressure to yield a white solid corresponding to $CF_3N(CF_2CF_2SO_3Li)_2$ (11.5 g) (confirmed by $^1H$ and $^{19}F$ NMR).

Preparation of Precursor 4: Dilithio-perfluoro(N,N'-bissulfoethyl)piperazine;

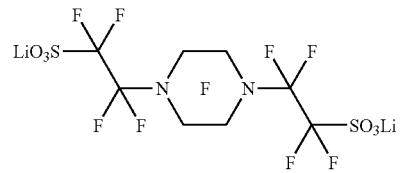

To a 500 mL flask fitted with a condenser, magnetic stirrer and a heated oil bath was charged with $LiOH$—$H_2O$ (10.59 g), perfluoro(N,N'-bis-fluorosulfoethyl)piperazine (30.0 g; prepared by electrochemical fluorination of N,N'-bis-fluorosulfoethyl piperazine which, in turn, was prepared by addition of piperazine to vinylsulfonyl fluoride as described in Krutak et al., J. Org. Chem., 44(2) 3847–58 (1979)) and water and isopropanol (100 mL each). After stirring under a nitrogen atmosphere for 1 hour at room temperature the reaction mixture was heated to 60° C. for 25 hours.

Upon cooling to room temperature, the reaction solution was treated with dry ice pellets and diatomaceous earth, and filtered. The filtrate was evaporated to dryness at 80°–110° C. and about 40 Torr, and the solid white residue was redissolved in warm ethanol (175 mL). After cooling to room temperature, the mixture was filtered, and the filtrate was evaporated at 30–80° C., 20 Torr, and then two portions of toluene (75 mL each) were added to the residue and subsequently removed by rotary-evaporation at 80° C., 20 Torr. A white powder was recovered (29.2 g; 96% yield). The structure of the product was confirmed by $^1H$ NMR, $^{19}F$ NMR and FTIR to be Dilithio-perfluoro(N,N-bissulfoethyl) piperazine.

Preparation of Precursor 5: $LiO_3S(CF_2)_3CO_2Li$

A 500 mL flask was charged with $FSO_2(CF_2)_3COF$ (188.5 g.; crude) and methanol (200 mL) the temperature being held between 0–25° C. After addition of water (250 mL) the lower phase was separated, and washed with three times with deionized water (100 mL each), followed by drying over anhydrous silica gel. After filtration, the intermediate, $FSO_2(CF_2)_3COOCH_3$, was purified by fractional distillation (140–145° C.; glc purity of >99.5%). $FSO_2(CF_2)_3COOCH_3$ was then hydrolyzed to, $KO_3S(CF_2)_3COOK$, by treatment with excess KOH in water.

The aqueous solution of this intermediate was acidified with excess $H_2SO_4$ and extracted into methyl-t-butyl ether (MTBE). The MTBE extract was evaporated to dryness under vacuum to yield $HO_3S(CF_2)_3CO_2H$ (44.5 g.). This material was dissolved in methanol (300 mL) and treated with $Li_2CO_3$ (29.5 g.) to produce $LiO_3S(CF_2)_3CO_2Li$. Decolorizing carbon (Darco G-60) was added to remove slight color and, after filtration to remove insoluble solids, the clear methanol filtrate was evaporated to dryness at room temperature under high vacuum to yield $LiO_3S(CF_2)_3CO_2Li$ (40.5 g.) as a white solid. Analysis of the product by $^1H$ and $^{19}F$ NMR indicated that it contained 70.83% of the title compound plus 13.3% structural isomers with a branched perfluoroalkylene chain. An additional 6.26% was incompletely hydrolyzed methyl ester, $LiO_3S(CF_2)_3COOCH_3$.

Preparation of PAG-1: $[(p-(CH_3)_3C-C_6H_4)_2I^+]_2-O_3S(CF_2)_3SO_3-$:

A 1.0 L Erlenmeyer flask was charged Precursor 1 (10.000 g), $(p-(CH_3)_3CC_6H_4)_2I_+^-OCOCH_3$ (25.385 g), deionized water (300 mL) and methylene chloride:methyl-t-butyl ether (300 mL of a 50:50 v/v mixture). The contents were stirred at room temperature for about one hour and then transferred to a 1.0 L separatory funnel and shaken vigorously. The organic phase was isolated and washed with four fresh portions of deionized water (300 mL each) and dried, with stirring, over silica gel for one hour. The ensuing solution was filtered through a 0.2 micron Tefsep™ filter to remove silica gel and the filtrate was evaporated to dryness on a rotary evaporator at 50° C. and approximately 20 Torr. The remaining residue was dissolved in ethyl acetate (50 mL) and subsequently precipitated by gradual addition of hexanes (300 mL) with stirring. The white crystalline precipitate was filtered, washed with hexanes:ethyl acetate (7:1 mixture) and dried partially by suction. Residual solvent was removed by vacuum drying at 50° C. overnight at 10 mTorr. A white powder (27.1 g; 88.1% yield; 193° C. m.p.) was isolated.

Quantitative $^1H$ and $^{19}F$ NMR spectroscopy in methanol-$d_4$ indicated the product was greater than 99% pure. The isolated material contained 99.4 mole % of the linear $(-CF_2-)_3$ group and 0.5% of the branched $(CF_2CF(CF_3)-$ isomer. Trace metal analysis by ICP and ICP-MS revealed that Li ion levels in the final product were below detection limits (<220 ppb) indicating the ion exchange was essentially complete. Total metal levels (of the 22 metals scanned) were less than 13 ppm. The onset of thermal decomposition determined under nitrogen by thermogravimetric analysis (TGA) was 224° C. The melting point was determined to be 193° C. by DSC.

Preparation of PAG-2: $[(p-(CH_3)_3C-C_6H_4)_2I^+]_2-O_3S(CF_2)_4SO_3-$

PAG-2 was prepared according to the procedure described for PAG-1 using Precursor 2 (7.500 g) and $(p-(CH_3)_3CC_6H_4)_2I^{+-}OCOCH_3$ (14.073 g). The crude material was recrystallized by dissolving it in a mixture of ethyl acetate (75 mL) and methylene chloride (90 mL) and gradual addition of hexanes (360 mL). After vacuum drying, a white powder was isolated (13.3 g; 74.6% yield; m.p. 178° C.). Quantitative $^1H$ and $^{19}F$ NMR spectroscopy in methanol-$d_4$ indicated the product was greater than 99.5% pure. The isolated material was determined to be essentially 100% linear $(-CF_2-)_4$ isomer, although a trace (0.068% by weight) of the monofunctional anion $n-C_4F_9SO_3^-$ was also observed. Trace metal analysis by ICP and ICP-MS revealed that K ion levels in the final product were below detection limits (<720 ppb). Total metal levels (of the 22 metals scanned) were less than 16 ppm. The onset of thermal decomposition determined under nitrogen by thermogravimetric analysis (TGA) was 237° C. The melting point was determined to be 178° C. by DSC. The product was soluble in PGMEA to greater than 4 wt %.

Preparation of PAG-3: $[(C_6H_5)_3S^+]_2CF_3N(CF_2CF_2SO_3^-)_2$:

A 500 mL Erlenmeyer flask was charged with Precursor 3 (5.000 g), $(C_6H_5)_3S^+Br$ (7.135 g), deionized water (150 mL) and methylene chloride (150 ml). The ensuing mixture was stirred at room temperature for about one hour and then transferred to a 500 mL separatory funnel and shaken vigorously. The organic phase was isolated and washed with four fresh portions of deionized water (150 mL each), then dried with stirring over silica gel for about one hour. The dried solution was filtered and the ensuing filtrate was evaporated to dryness on a rotary evaporator at 50° C. and approximately 20 Torr. The remaining oily residue was dissolved in a mixture of ethyl acetate and methylene chloride (25 mL and 50 mL respectively) and subsequently precipitated as an oil by gradual addition of hexanes (175 mL). The oil phase was isolated and then triturated with two portions of hexane (250 mL each), which caused the product to crystallize.

The solid crystalline product was isolated by filtration, washed with additional hexane and dried at 50° C., 10 mTorr in a vacuum oven. After vacuum drying, a white powder was isolated (6.424 g; 63.7% yield; 138° C. m.p.). The structure of the final product was confirmed by $^1H$ and $^{19}F$ NMR spectroscopy in methanol-$d_4$. The onset of thermal decomposition determined under nitrogen by thermogravimetric analysis (TGA) was 411° C. The melting point was determined to be 138° C. by DSC.

Comparative Cationic Curing Activities of PAGs Determined by Photo-DSC/DSC:

This example describes photo-DSC/DSC experiments designed to quantitatively compare the relative cationic curing reactivities of PAGs of the present invention containing difunctional fluoroorganic sulfonate anions with related PAGs having identical cations and monofunctional perfluoroalkanesulfonate anions. Relative reactivities were measured in three different cationically polymerizable monomer systems, including two different types of epoxies and one vinyl ether.

The photo-DSC experiment provides information on the photo-cure speed at 30° C. as measured by the induction time (onset) and time to reach the peak maximum in the curing exotherm. Shorter induction and peak maximum times indicate faster photo-cure speeds and a more active PAG. The energy released under the curing exotherm is a measure of the extent of cure; larger values mean more cure has taken place during the light exposure. The DSC scan provides information about rate and degree of cure after light exposure from the energy (larger values means more cure) and the onset and peak temperature (lower temperatures indicate a faster cure rate and a more active initiator). Comparison with the DSC traces recorded with no prior light exposure provides a measure of the increase in activity after photoactivation of the PAG.

General: Stock solutions of three cationically curable monomers were prepared as shown in Table 3 with 0.1% (w/w) isopropylthioxanthone (ITX). Epon 828 is a difunctional glycidyl ether epoxy from Shell, ERL-4221 is a difunctional cycloaliphatic epoxy from Union Carbide and VEX 5015 is a trifunctional vinyl ether from Allied Signal. Because of the low sensitivity of these compositions to room lights, all sample preparation was done with the lab lights on but the hood lights off. All PAGs were formulated at 1.0% by weight in the stock monomer/sensitizer solutions. Into a small aluminum pan was weighed 0.02 g of PAG and 0.04 g of propylene carbonate used to promote dissolution of the PAG in the monomer. The pan was heated briefly on a hot plate set at 100° C. to dissolve the PAG, then 2.0 g the stock monomer/sensitizer solution was added. The solution was briefly heated again on a hot plate set at 100° C. to allow complete mixing of the components, then the solution was allowed to cool to room temperature before using.

TABLE 3

Stock Solutions

| Stock Solution | Monomer |
|---|---|
| 1 | Epon ™ 828 |
| 2 | ERL-4221 |
| 3 | VEX-5015 |

Below are tabulated results (Tables 4, 5 & 6) for the three reactive monomer systems:

Comparing the DSC traces recorded without light exposure (DSC Only) to the DSC traces recorded after the PDSC scans indicates that all of the irradiated samples show a shift to lower cure temperature judging from the onset and peak position of the curing exotherm. This indicates that all the PAG samples have undergone photogeneration of an active photoacid catalyst or initiator upon light exposure. With the highly reactive vinyl ether monomer, most of the curing occurs during the PDSC experiment at 30° C. In the case of the two less reactive epoxy monomers, curing during the PDSC experiment is minimal and most of the curing occurs during the subsequent temperature ramp applied during the DSC experiment. In all cases the reactivity of the difunctional PAGs of the present invention toward the various monomers is comparable, within error limits, to PAGs containing monofunctional perfluoroalkanesulfonate anions. Thus, in cationically polymerizable monomer systems such

TABLE 4

Photoacid Generators Tested in Epon ™ 828

| | | PDSC | | | DSC after PDSC | | | DSC Only (dark) | | |
|---|---|---|---|---|---|---|---|---|---|---|
| Ex | PAG | Energy (J/g) | Peak Max | Induction Time | Onset Temp (C.°) | Peak Max | Energy (J/g) | Onset Temp (C.°) | Peak Max | Energy (J/g) |
| C1 | DTBPI-ONf | 10 | 21.2 | 12.5 | 100 | 190 | 558 | 175 | 232 | 606 |
| C2 | DTBPI-PFOS | 4 | 28.4 | 18.9 | 100 | 197 | 566 | 175 | 238 | 608 |
| 1 | PAG1 | 8 | 27 | 16.2 | 100 | 192 | 553 | 180 | 230 | 576 |
| 2 | PAG2 | 7 | 27 | 17.1 | 110 | 194 | 541 | 175 | 232 | 574 |

TABLE 5

Photoacid Generators Tested in ERL-4221

| | | PDSC | | | DSC after PDSC | | | DSC Only (dark) | | |
|---|---|---|---|---|---|---|---|---|---|---|
| Ex | PAG | Energy (J/g) | Peak Max | Induction Time | Onset Temp (C.°) | Peak Max | Energy (J/g) | Onset Temp (C.°) | Peak Max | Energy (J/g) |
| C3 | DTBPI-ONf | 5 | 24 | 15.7 | 50 | 148 | 577 | 150 | 192 | 566 |
| C4 | DTBPI-PFOS | 4 | 22.4 | 14.8 | 65 | 155 | 560 | 150 | 190 | 583 |
| 3 | PAG1 | 7 | 24 | 15.1 | 60 | 148 | 582 | 150 | 203 | 565 |
| 4 | PAG2 | 10 | 25 | 14.8 | 60 | 142 | 538 | 150 | 196 | 574 |

TABLE 6

Photoacid Generators Tested in VEX 5015

| | | PDSC | | | DSC after PDSC | | | DSC Only (dark) | | |
|---|---|---|---|---|---|---|---|---|---|---|
| Ex | PAG | Energy (J/g) | Peak Max | Induction Time | Onset Temp (C.°) | Peak Max | Energy (J/g) | Onset Temp (C.°) | Peak Max | Energy (J/g) |
| C5 | DTBPI-ONf | 242 | 2.8 | 0.9 | 125 | 159 | 31 | 100, 155 | 116, 173 | 305, 44 |
| C6 | DTBPI-PFOS | 230 | 3.2 | 1.1 | 140 | 163 | 24 | 100, 160 | 116, 175 | 305, 33 |
| 5 | PAG1 | 209 | 4.2 | 1.6 | 45, 130 | 79, 155 | 54 | 100, 160 | 121, 169 | 298, 57 |
| 6 | PAG2 | 220 | 3.4 | 1.3 | 135 | 158 | 31 | 100, 160 | 115, 170 | 290, 54 | as these, there does not appear to be a significant difference in the reactivity of photoacids produced from difunctional fluoroorganic sulfonate anions of the present invention and those generated from monofunctional perfluoroalkane-sulfonate anions.

Volatility of $HO_3S(CF_2)_4SO_3H$—Distillation Results

This example describes an unsuccessful attempt to vacuum distill the difunctional perfluoroorganic disulfonic acid, $HO_3S(CF_2)_4SO_3H$, illustrating the very low volatility of this diacid compared to monofunctional perfluoroalkane-sulfonic acids of even higher molecular weight, like $C_8F_{17}SO_3H$. The dipotassium salt, $KO_3S(CF_2)_4SO_3K$ (40.0 g) and 100% $H_2SO_4$ (241 g) were charged to a vacuum distillation apparatus comprising a 250 mL, three-necked flask equipped with a heating mantle, magnetic stirring bar, an insulated short path distillation head and a 100 mL receiver flask. The pot temperature and head temperature were continuously monitored with J-type thermocouple probes. At a starting pressure of 8.0 Torr the pot temperature was gradually raised to 171° C., but no boiling or distillation was observed. The pressure was reduced to 3.6 Torr and the pot temperature raised to 178° C., but still there was no boiling or distillation. The pressure was reduced further and additional heat was applied to the pot to force distillation. Distillate eventually started to collect at a pot temperature of 196° C. and a pressure of 1.75 Torr. A total of 73.3 g of distillate was collected between 184–186° C. (head temperature) before the distillation was terminated. Since this represents 222% of the theoretical $HO_3S(CF_2)_4SO_3H$ yield, it was surmised that the distillate was probably mostly sulfuric acid. The presence of significant $H_2SO_4$ in the distillate was confirmed by precipitation of $BaSO_4$ upon treatment of an aqueous solution of the distillate with $BaCl_2$.

The remaining pot retains were diluted in about 700 mL of water and treated with 350 mL of tributylamine with stirring. A white solid precipitate presumed to be $Bu_3NH^+{}^-O_3S(CF_2)4SO_3^-Bu3NH^+$ formed which was isolated by suction filtration washed with three portions of water and air-dried by suction to yield 44.07 g (66% of theory). The results indicate that most, if not all, of the difunctional acid remained in the still pot and did not distill even under these relatively extreme conditions. In comparison, a similar vacuum distillation conducted at 8.00 Torr using 100 g of $C_8F_{17}SO_3K$ and 300 g of 100% $H_2SO_4$ resulted in distillation of $C_8F_{17}SO_3H$ in 87% yield at a relatively moderate pot temperature of 148–157° C. and a head temperature of 135–142° C. Thus, even though the molecular weight of this monofunctional acid is 38% greater than that of $HO_3S(CF_2)_4SO_3H$, it is much more volatile and distills at much lower temperature than the difunctional acid. The relatively low volatility of the difunctional acid is attributed to the presence of two highly polar sulfonic acid groups and the unique ability of each molecule to participate in multiple intermolecular interactions (e.g., hydrogen bonding and dipolar interactions).

Bio-elimination Screening Results

The objective of this study was to evaluate the potential for oral absorption, distribution, and serum and liver elimination rates of $KO_3SCF_2CF_2CF_2CF_2SO_3K$ and $LiO_3SCF_2CF_2CF_2COOLi$ in male Sprague Dawley rats after a single oral dose. Quantitation of fluorinated salt levels and potential metabolites in serum and liver were performed by total organic fluorine analysis.

Methods:

21 male Sprague Dawley rats (Harlan), 6–8 weeks in age and weighing approximately 150–250 g were treated with a single dose of the test compound, prepared in propylene glycol (suspension of 6 mg/ml propylene glycol), via oral gavage at either 0 mg/kg (control) or 30 mg/kg body weight (Group 1) (3 animals per dose group per designated treatment period). Necropsies were performed on day zero, one, four, eight, and day fifteen post dose. Liver and serum samples were collected for total fluorine analysis on each of those days. All the specimens collected at necropsy were temporarily stored in at −70° C. A complete protocol for this study is available (Strategic Toxicology Lab Protocol Number ST-88). Urine samples were collected and analyzed by $^{19}F$ NMR on day one and day four (0–4, 4–24 and 76–100 hrs, respectively) post dose in order to determine the concentration of the respective perfluorinated anion.

TABLE 7

Bio-elimination test results for $KO_3SCF_2CF_2CF_2CF_2SO_3K$; levels of fluorine detected in liver and serum samples.

| Group | Dose | Total N* | Total F concentration in Liver (Serum), ppm | | | | |
|---|---|---|---|---|---|---|---|
| | | | Day 0 | Day 1 | Day 4 | Day 8 | Day 14 |
| Control | — | 6 | **ND (ND) | — | — | — | ND (ND) |
| 1 | 30 mg/kg | 15 | ND (ND) | 0.6 (ND) | ND (ND) | ND (ND) | ND (ND) |

**ND = not detectable within limits of test (0.3 ppm)
*N = number of rats

TABLE 8

Bio-elimination test results for $LiO_3SCF_2CF_2CF_2CO_2Li$; levels of fluorine detected in liver and serum samples.

| Group | Dose | Total N* | Total F concentration in Liver (Serum), ppm | | | | |
|---|---|---|---|---|---|---|---|
| | | | Day 0 | Day 1 | Day 4 | Day 8 | Day 14 |
| Control | — | 6 | **ND (ND) | — | — | — | ND (ND) |
| 1 | 30 mg/kg | 15 | 0.5 (ND) | ND (ND) | ND (ND) | ND (ND) | ND (ND) |

**ND = not detectable within limits of test (0.3 ppm)
*N = number of rats

The data summarized in Tables 7 and 8 suggest that these materials have a very short half-life in these tissues or they are not readily absorbed in these tissues through oral administration. No serum fluorine was detected above the detectability limits of 0.5 ppm at any time point following treatment for either of the dosed difunctional salts. Fluorine levels measured in the liver after each treatment period were near or below detection limits for both compounds. In the case of the 3-carboxyhexafluoropropanesulfonic acid salt, greater than 96% of the parent compound was recovered in the urine within the first 28 hours post dose, indicating that the estimated half life of elimination via the urinary route is less than 28 hours. For the 1,4-perfluorobutane-disulfonic acid salt, 11% of the parent compound was recovered in the urine within the first 28 hours post dose, suggesting that this compound is poorly adsorbed from the gut into the bloodstream. The tests also indicate that at the present dosing level, the materials have no obvious acute toxicological effects. This suggests that salts of 1,4-perfluorobutane-disulfonic acid and 3-carboxyhexafluoropropanesulfonic acid are relatively safe and have a tendency to bio-eliminate.

The invention claimed is:

1. An ionic photoacid generator comprising:
   (a) an I-, or S-centered onium cation, and
   (b) an anion of the formula $^-O_3S—R_f-Z$ where:
   $R_f$ is a perfluorinated divalent alkylene, combinations thereof, optionally containing catenary S or N; and
   Z is $—SO_3^-$ or $—CO_2^-$.

2. The ionic photoacid generator of claim 1 wherein $R_f$ is a perfluorinated divalent alkylene having 1 to 12 catenary carbon atoms.

3. The photoacid generator of claim 2, wherein said $R_f$ group is of the structure $—C_nF_{2n}—$, wherein n is 1 to 12.

4. The ionic photoacid generator of claim 1 wherein $R_f$ is a perfluorinated divalent cycloalkylene having at least 5 ring atoms.

5. The ionic photoacid generator of claim 1 wherein Z is $—CO_2^-$ and $R_f$ is a perfluorinated divalent alkylene, a perfluorinated divalent cycloalkylene or combinations thereof.

6. The photoacid generator of claim 5 wherein said perfluorinated divalent alkylene has 2 to 7 carbon atoms.

7. The ionic photoacid generator of claim 1 wherein Z is $—SO_3^-$ and $R_f$ is a perfluorinated divalent alkylene group, a perfluorinated divalent cycloalkylene group or combinations thereof.

8. The photoacid generator of claim 7 wherein said perfluorinated divalent alkylene has 2 to 7 carbon atoms.

9. The ionic photoacid generator of claim 1, wherein one or more non-adjacent $—CF_2—$ groups of said $R_f$ are substituted by a $—SF_4—$ group or a $—NR_f'—$ group, wherein $R_f'$ is a perfluorinated alkyl or cycloalkyl.

10. The ionic photoacid generator of claim 1, wherein one or more non-adjacent

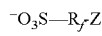

groups are replaced by a

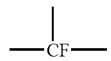

group or a

group.

11. The photoacid generator of claim 1 wherein said anion is selected from the group consisting of

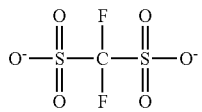 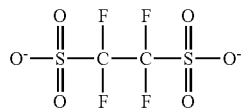

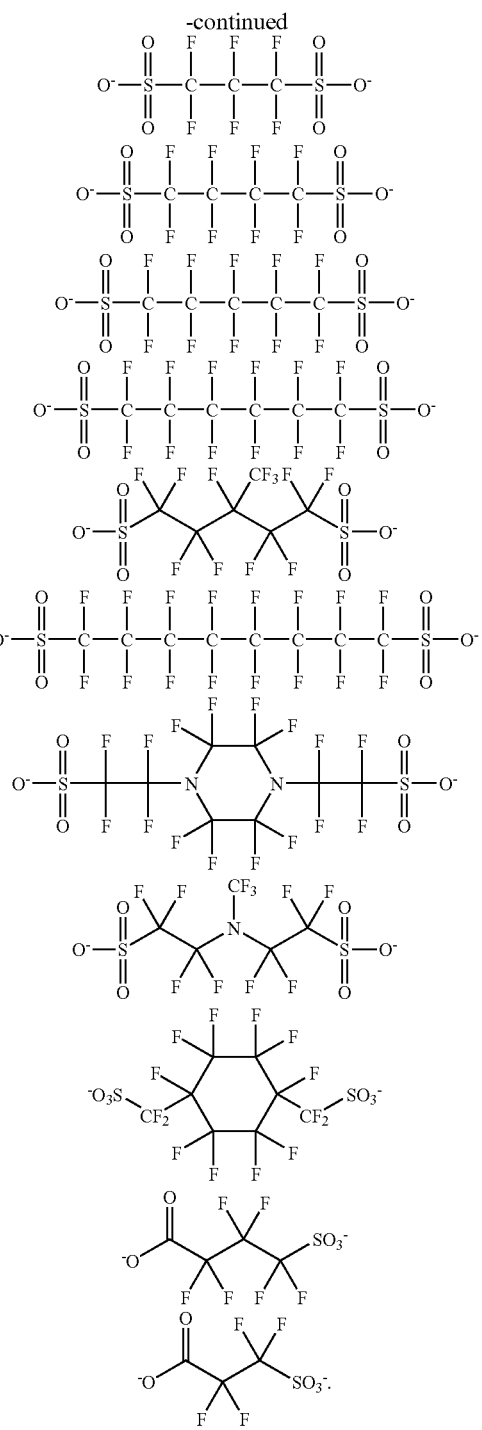

12. The photoacid generator of claim 1 wherein said S-centered organic onium cation is a sulfoxonium, triarylsulfonium, dialkylarylsulfonium, diarylalkylsulfonium, or trialkylsulfonium cation.

13. The photoacid generator of claim 1 wherein said organic onium cation is selected from the group consisting of diphenyliodonium, ditolyliodonium, didodecylphenyliodonium, (4-octyloxyphenyl)phenyliodonium, bis(methoxyphenyl)iodonium; triphenylsulfonium, diphenyl-4-thiophenoxyphenylsulfonium, 1,4-phenylene-bis(diphenylsulfonium), bis-(4-t-butylphenyl)-iodonium, (4-t- butyl-phenyl)-diphenyl-sulfonium, tris-(t-butyl-phenyl)-sulfonium, (4-butoxy-phenyl)-diphenylsulfonium, 1-(2-naphthalen-2-yl-2-oxo-ethyl)-tetrahydr-thiophenium, dimethyl-(2-oxo-cyclohexyl)-sulfonium, bicyclo[2,2,1]hept-2-yl-methyl-(2-oxo-cyclohexyl)-sulfonium, cyclo-hexyl-methyl-(2-oxo-cyclohexyl)-sulfonium, dimethyl-(2-oxo-2-phenyl-ethyl)-sulfonium, (4-hydroxy-3,5-dimethyl-phenyl)-dimethyl-sulfonium, and (4-isopropyl-phenyl)-p-tolyl-iodonium.

14. A photoresist composition comprising
   i) the photoacid generator of claim 1, and
   ii) a resist polymer.

15. The photoresist composition of claim 14 wherein said resist polymer is selected from the group of polyphthaldehyde, polyacrylates, polymethacrylates, polystyrenes, polycycloolefins, polycycloolefin-maleic anhydride copolymers, copolymers of fluoroolefins with cycloolefins, and phenol-formaldehyde condensation polymers.

16. The photoresist composition of claim 14 wherein said resist polymer is a positive resist polymer.

17. The photoresist composition of claim 16 wherein said positive resist polymer contains acid labile functional groups, which cleave on exposure to acid.

18. The photoresist composition of claim 16 wherein said positive resist polymer contains functional groups, which deprotect upon exposure to acid.

19. The photoresist composition of claim 18 wherein said functional groups of said positive resist polymer are selected from ester groups, carbonate groups, silyl ether groups, acetal and ketal groups, and ether groups.

20. The photoresist composition of claim 14 comprising 0.1 to 10 wt. % of said photoacid generator.

21. The photoresist composition of claim 14 comprising 1 to 5 wt. % of said photoacid generator.

22. The photoresist composition of claim 14 wherein said resist polymer is a negative resist polymer, having crosslinkable functional groups.

23. The photoresist composition of claim 22 wherein said functional groups of said negative resist polymer are selected from epoxides, cyclic ethers, vinyl ethers, vinylamines, side-chain unsaturated aromatic hydrocarbons, lactones, lactams, oxazolines, cyclic carbonates, cyclic acetals, aldehydes, cyclic amines, cyclic sulfides, cyclosiloxanes, cyclotriphosphazenes, olefins and cycloolefins.

24. A method of preparing a photoresist comprising the steps of:
   a) coating a substrate with a mixture of a resist polymer and the photoacid generator of claim 1, and
   b) selectively irradiating said coating to activate said photoacid generator.

25. The method of claim 24 wherein said coating is selectively irradiated by means of laser writing.

26. The method of claim 24 wherein said coating is selectively irradiated by means of a mask.

27. The method of claim 24 further comprising the step of heating said irradiated coating at elevated temperatures to effect differential solubility of said irradiated regions.

28. The method of claim 27 further comprising the step of developing said irradiated coating to selectively dissolve soluble portions of the irradiated coating.

29. The method of claim 24 wherein said substrate is selected from silicon wafers, metal clad substrates and metal printing plates.

30. A curable composition comprising:
   1) the ionic photoacid generator of claim 1; and
   2) one or more monomers comprising at least one of a cationically polymerizable monomer, an ethylenically-unsaturated free radically polymerizable monomer, or multifunctional or multireactive monomers polymerizable by acid-catalyzed step-growth polymerization, or multifunctional or multireactive monomers polymerizable by any combination of these polymerization mechanisms, and mixtures thereof.

31. The curable composition of claim 30 wherein the ionic photoacid generator is a photosensitive salt in the concentration range from 0.1 to 10 wt. %.

32. A method of making a polymer comprising the steps of
   (a) providing a monomer mixture comprising at least one of a cationically polymerizable monomer, an ethylenically-unsaturated free radically polymerizable monomer, or multifunctional or multireactive monomers polymerizable by acid-catalyzed step-growth polymerization, or multifunctional or multireactive monomers polymerizable by any combination of these polymerization mechanisms, and mixtures thereof, and a catalytically effective amount of a curing agent to the monomer mixture wherein the curing agent comprises at least one photoacid generator of claim 1, thereby forming a polymerizable composition, and
   (b) polymerizing the mixture composition with a sufficient amount of actinic radiation.

* * * * *

UNITED STATES PATENT AND TRADEMARK OFFICE
CERTIFICATE OF CORRECTION

PATENT NO. : 7,122,294 B2
APPLICATION NO. : 10/444124
DATED : October 17, 2006
INVENTOR(S) : William M. Lamanna It is certified that error appears in the above-identified patent and that said Letters Patent is hereby corrected as shown below:

<u>On the Title Page, in Col. 2, under (Other Publications)</u>
Line 1, delete "et al," and insert -- et al., --, therefor.
Line 1, delete "presenc e" and insert -- presence --, therefor.
Line 2, delete "carobylate" and insert -- carboxylate --, therefor.

<u>On the Second Page, in Col. 1, under (Other Publications)</u>
Line 1, delete "et al" and insert -- et al. --, therefor.
Line 11, delete "Senod" and insert -- Second --, therefor.

<u>Col. 7</u>
Lines 2-3, delete "perfluoroalalkyl" and insert -- perfluoroalkyl --, therefor.
Line 43-49, in (Structure 1)

delete " 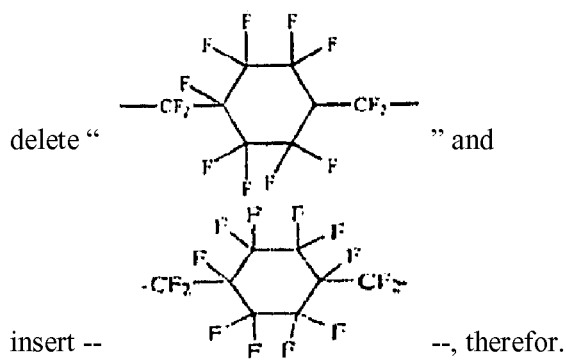 " and insert -- -- therefor.

<u>Col. 8</u>
Line 25, after "et al." insert -- ), --.

<u>Col. 12</u>
Line 37, delete "nitrites," and insert -- nitriles, --, therefor.

<u>Col. 23</u>
Lines 13-14, delete "60 mw/cm" and insert -- 60 mw/cm$^2$ --, therefor.
Line 27, delete "LiOH.H$_2$O" and insert -- LiOH·H$_2$O --, therefor.

UNITED STATES PATENT AND TRADEMARK OFFICE
CERTIFICATE OF CORRECTION

PATENT NO. : 7,122,294 B2
APPLICATION NO. : 10/444124
DATED : October 17, 2006
INVENTOR(S) : William M. Lamanna It is certified that error appears in the above-identified patent and that said Letters Patent is hereby corrected as shown below:

Col. 31
Line 8, in Claim 1, after "alkylene," insert -- cycloalkylene or --.
Line 10, in Claim 1, delete "–$SO_3$" and insert -- –$SO_3^-$ --, therefor.
Line 16, in Claim 3, after "$R_f$" delete -- group --.
Line 27, in Claim 7, delete "alkylene group," and insert -- alkylene, --, therefor.
Line 28, in Claim 7, after "cycloalkylene" delete --group --.

Signed and Sealed this

Eighth Day of April, 2008

JON W. DUDAS
*Director of the United States Patent and Trademark Office*